US012610829B2

(12) United States Patent
Chi et al.

(10) Patent No.: US 12,610,829 B2
(45) Date of Patent: Apr. 21, 2026

(54) POWER MODULE PACKAGE WITH MOLDED VIA AND DUAL SIDE PRESS-FIT PIN

(71) Applicant: SEMICONDUCTOR COMPONENTS INDUSTRIES, LLC, Scottsdale, AZ (US)

(72) Inventors: Heejo Chi, Yeoju-si (KR); Seungwon Im, Bucheon (KR); Oseob Jeon, Seoul (KR)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 379 days.

(21) Appl. No.: 18/326,459

(22) Filed: May 31, 2023

(65) Prior Publication Data

US 2024/0404926 A1     Dec. 5, 2024

(51) Int. Cl.
  *H01L 23/495*     (2006.01)
  *H01L 21/56*      (2006.01)
  *H01L 23/31*      (2006.01)
(52) U.S. Cl.
  CPC ...... *H01L 23/49548* (2013.01); *H01L 21/565* (2013.01); *H01L 23/3107* (2013.01); *H01L 23/49503* (2013.01); *H01L 23/49531* (2013.01); *H01L 23/49562* (2013.01); *H01L 23/49575* (2013.01); *H01L 2224/48247* (2013.01); *H01L 2924/13055* (2013.01); *H01L 2924/13091* (2013.01); *H01L 2924/1815* (2013.01)

(58) Field of Classification Search
None
See application file for complete search history.

(56) References Cited

U.S. PATENT DOCUMENTS

| | | | |
|---|---|---|---|
| 2009/0146272 A1 | 6/2009 | Kessler et al. | |
| 2010/0133667 A1 | 6/2010 | Oka et al. | |
| 2014/0091683 A1 | 4/2014 | Ito et al. | |
| 2017/0263527 A1 | 9/2017 | Mohn et al. | |
| 2020/0303215 A1* | 9/2020 | Ichikawa | H01L 23/48 |
| 2024/0170378 A1* | 5/2024 | Chi | H01L 24/73 |

FOREIGN PATENT DOCUMENTS

| | | |
|---|---|---|
| JP | 2013152966 A | 8/2013 |
| WO | 2024107514 A1 | 5/2024 |

OTHER PUBLICATIONS

International Search Report and Writen Opinion for PCT Application No. PCT/US2024/031024, mailed on Oct. 7, 2024, 16 pages.

* cited by examiner

*Primary Examiner* — Feifei Yeung Lopez
(74) *Attorney, Agent, or Firm* — Brake Hughes Bellermann LLP

(57) ABSTRACT

A module includes an assembly of a semiconductor device die coupled to a lead frame. A board is disposed below the lead frame. The board includes a plated-through hole (PTH) aligned with an opening in the lead frame above the board. The module further includes a mold body encapsulating at least a portion of the assembly. The mold body includes a through-mold via (TMV) aligned with the opening in the lead frame and with the PTH. The PTH is physically accessible from outside the mold body through the TMV and the opening in the lead frame.

21 Claims, 20 Drawing Sheets

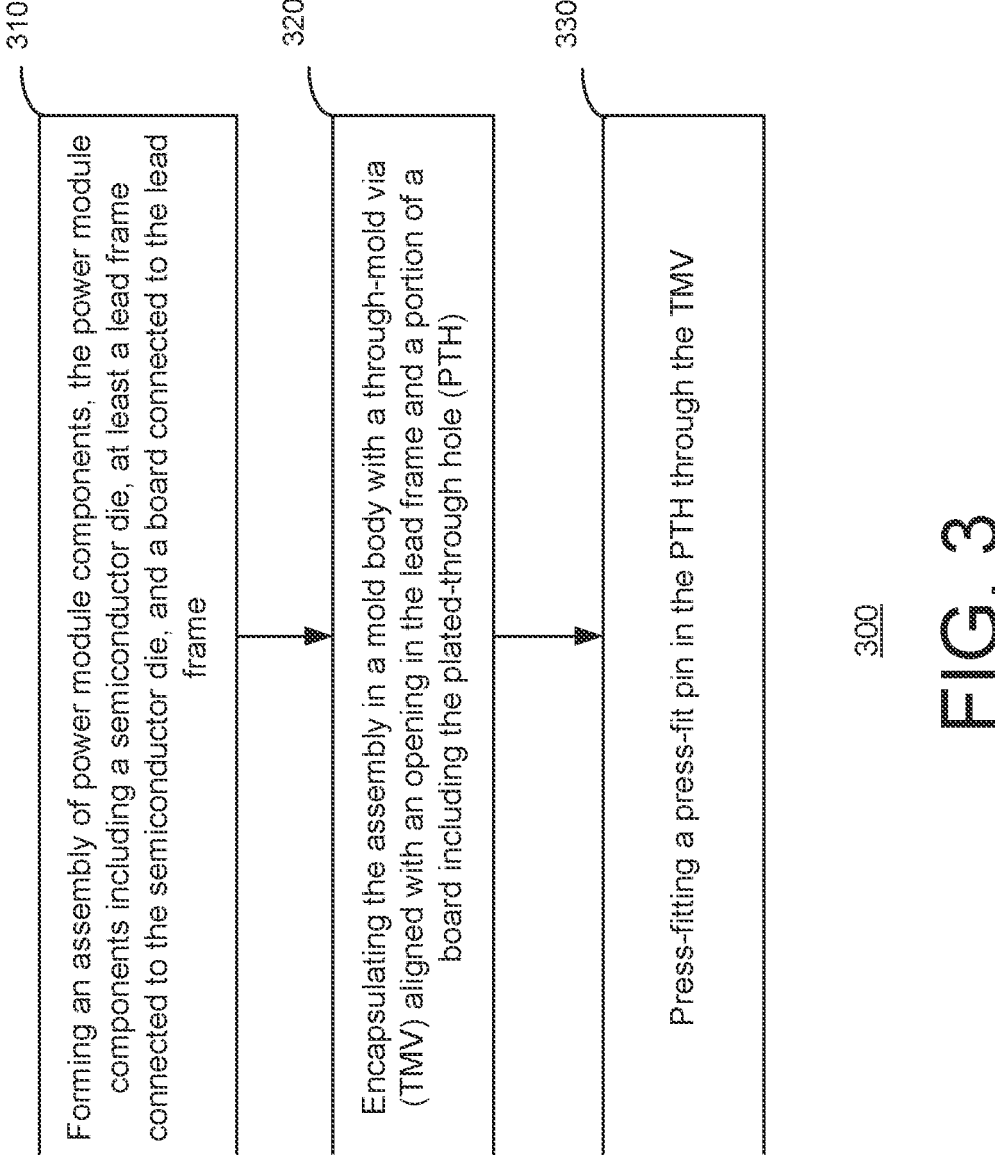

Forming an assembly of power module components, the power module components including a semiconductor die, at least a lead frame connected to the semiconductor die, and a board connected to the lead frame Encapsulating the assembly in a mold body with a through-mold via (TMV) aligned with an opening in the lead frame and a portion of a board including the plated-through hole (PTH)

Press-fitting a press-fit pin in the PTH through the TMV

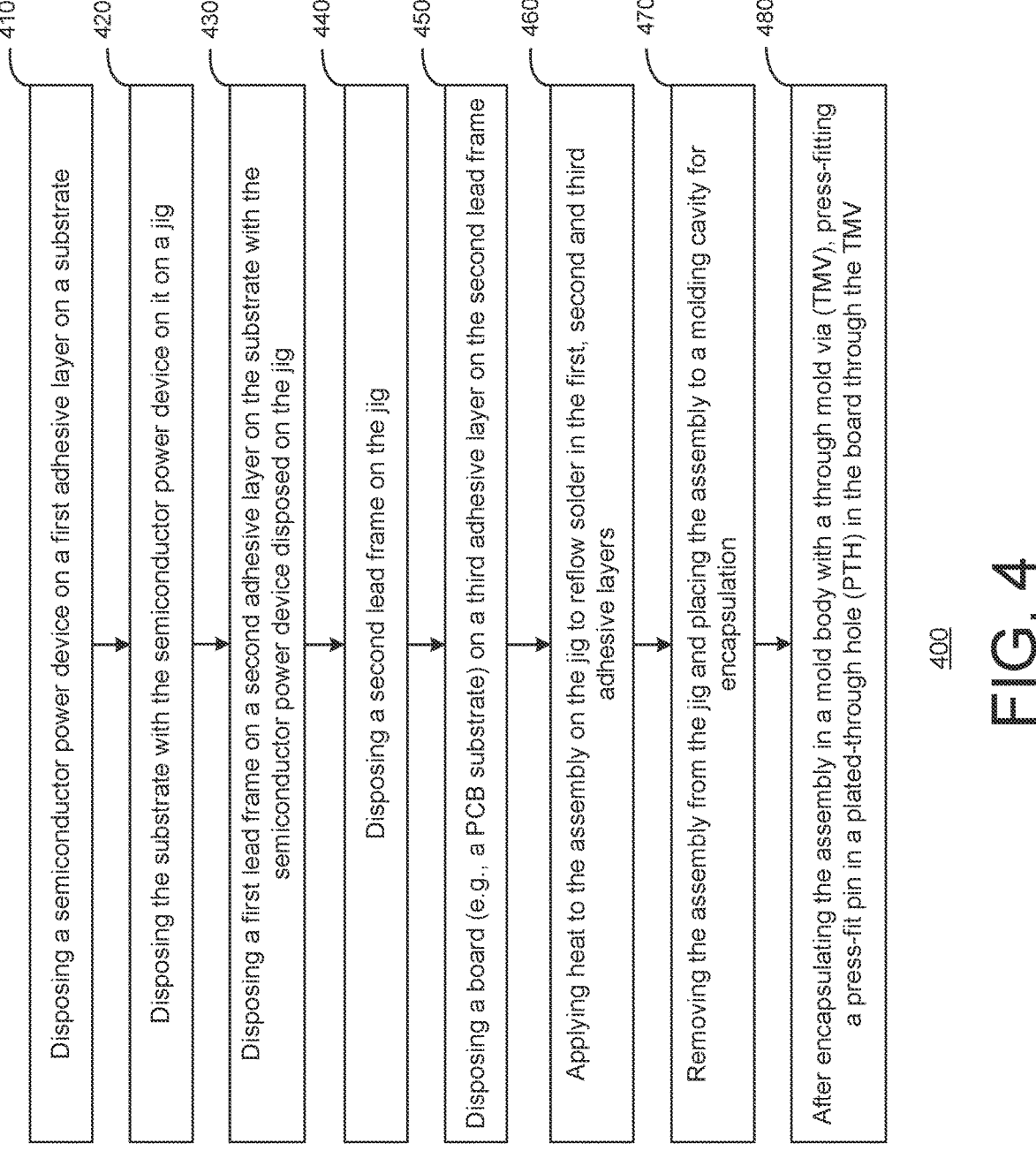

410 — Disposing a semiconductor power device on a first adhesive layer on a substrate 420 — Disposing the substrate with the semiconductor power device on it on a jig 430 — Disposing a first lead frame on a second adhesive layer on the substrate with the semiconductor power device disposed on the jig 440 — Disposing a second lead frame on the jig 450 — Disposing a board (e.g., a PCB substrate) on a third adhesive layer on the second lead frame 460 — Applying heat to the assembly on the jig to reflow solder in the first, second and third adhesive layers 470 — Removing the assembly from the jig and placing the assembly to a molding cavity for encapsulation 480 — After encapsulating the assembly in a mold body with a through mold via (TMV), press-fitting a press-fit pin in a plated-through hole (PTH) in the board through the TMV

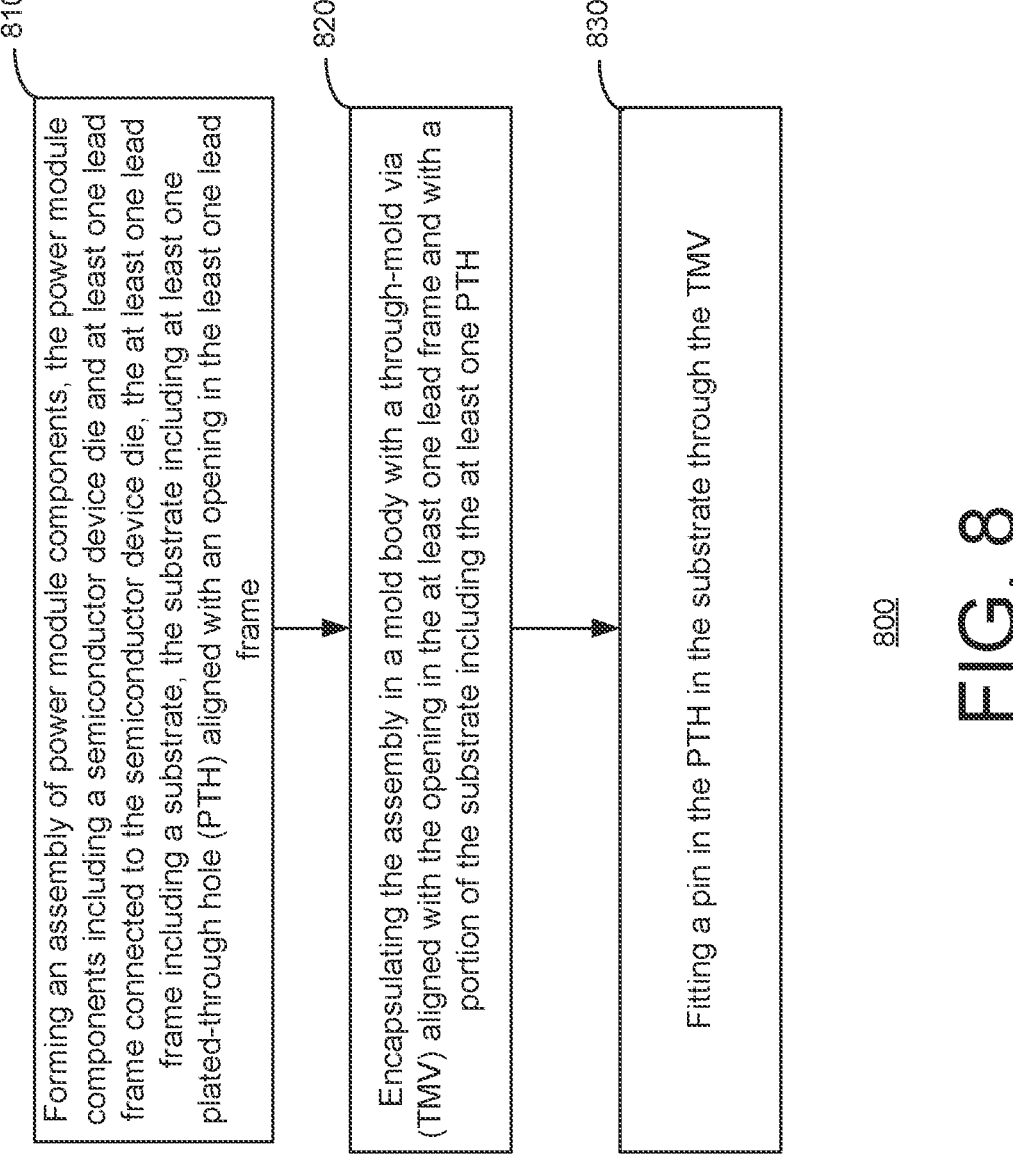

810 Forming an assembly of power module components, the power module components including a semiconductor device die and at least one lead frame connected to the semiconductor device die, the at least one lead frame including a substrate, the substrate including at least one plated-through hole (PTH) aligned with an opening in the least one lead frame 820 Encapsulating the assembly in a mold body with a through-mold via (TMV) aligned with the opening in the at least one lead frame and with a portion of the substrate including the at least one PTH 830 Fitting a pin in the PTH in the substrate through the TMV

POWER MODULE PACKAGE WITH MOLDED VIA AND DUAL SIDE PRESS-FIT PIN

RELATED APPLICATION

This application is related to U.S. patent application Ser. No. 18/056,442, filed on Nov. 17, 2022, which is incorporated by reference in its entirety herein.

TECHNICAL FIELD

This description relates to power devices and circuits. More specifically, this disclosure relates to power device modules or packages.

BACKGROUND

Power device packages are used in many power electronics circuits (e.g., power electronics circuits for home appliances, the automotive industry, and other industrial applications). An example power device package can include one or more semiconductor device die encapsulated in mold material within a housing. The semiconductor device die can be electrically coupled to lead frames that form the external power terminals of the power device package. The power device package may also include a set of signal leads and a set of power leads extending from the housing. The set of signal leads and the set of power leads extending from the housing may be soldered to, or coupled using press-fit pins to, an external substrate (e.g., a printed circuit board (PCB) of a host power electronics circuit.

SUMMARY

In a general aspect, a module includes an assembly of a semiconductor device die coupled to a lead frame. A board is disposed below the lead frame. The board includes a plated-through hole (PTH) aligned with an opening in the lead frame above the board. The module further includes a mold body encapsulating at least a portion of the assembly. The mold body includes a through-mold via (TMV) aligned with the opening in the lead frame and with the PTH. The PTH is physically accessible from outside the mold body through the TMV and the opening in the lead frame.

In a general aspect, a module includes a power device encapsulated in a mold body, and a first lead frame and a second lead frame electrically connected to the power device encapsulated in the mold body. The first lead frame includes a first press-fit pin coupler, and the second lead frame includes a second press-fit pin coupler. A portion of the first press-fit pin coupler and a portion of the second press-fit pin coupler are disposed outside the mold body.

In a general aspect, a method includes forming an assembly including a semiconductor device die and at least one lead frame connected to the semiconductor device die. The at least one lead frame includes a substrate. The substrate has at least one plated-through hole (PTH) aligned with an opening in the least one lead frame. The method further includes encapsulating the assembly in a mold body with a through-mold via (TMV) aligned with the opening in the at least one lead frame and with a portion of the substrate including the at least one PTH, the at least one PTH being exposed in the TMV to an environment outside the mold body and being physically accessible from outside the mold body through the TMV.

BRIEF DESCRIPTION OF THE DRAWINGS

FIG. 3 illustrates an example method for assembling a power module with a press-fit pin as an external signal or power lead.

FIG. 4 illustrates an example method for assembling a power module with a press-fit pin as an external signal or power lead.

FIG. 8 illustrates an example method for assembling a power module with a press-fit pin as an external signal or power lead.

Figure 1A:
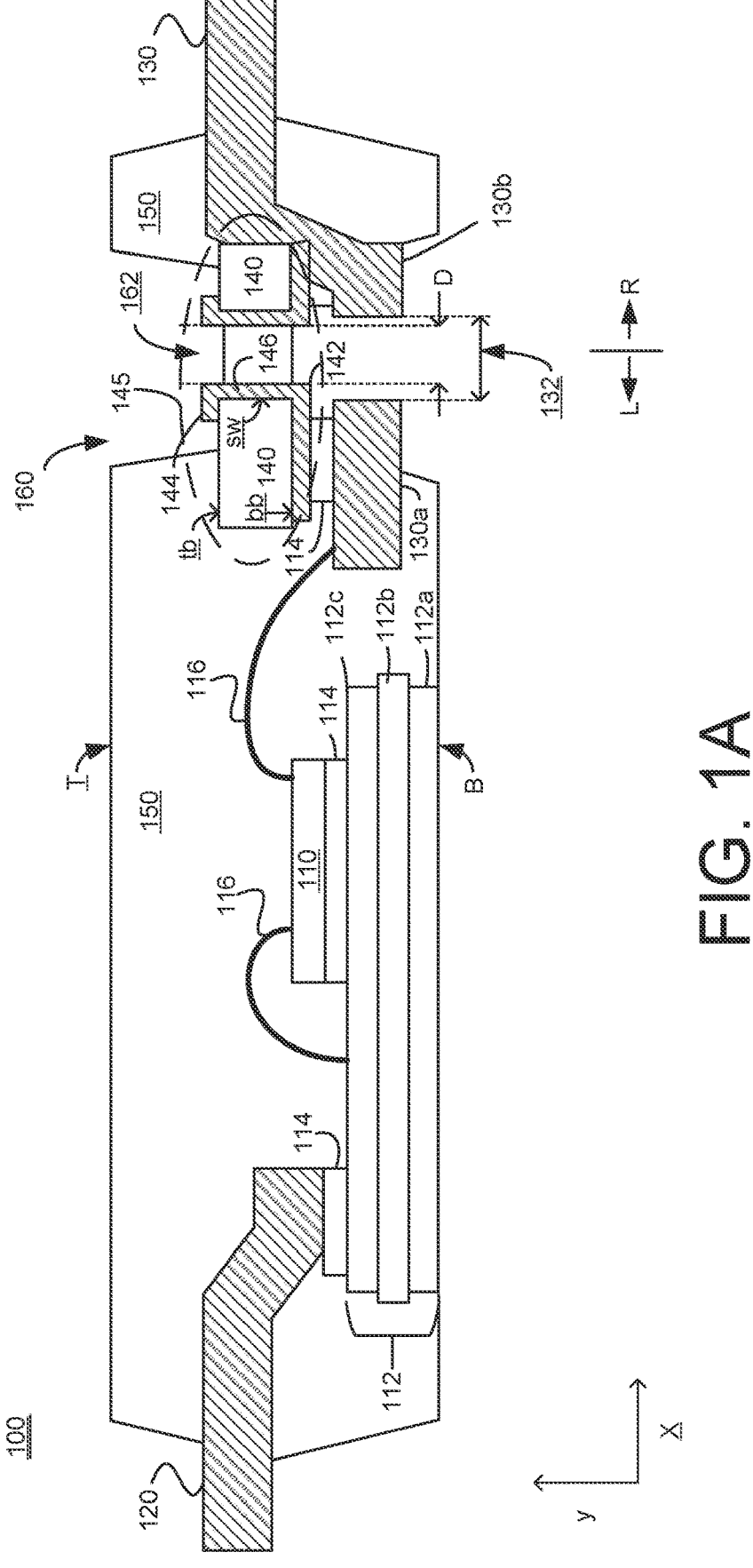
FIG. 1A illustrates, in a cross-sectional view, a power module including a press-fit pin coupler.

In the drawings, which are not necessarily drawn to scale, like reference symbols may indicate like and/or similar components (elements, structures, etc.) in different views. The drawings illustrate, by way of example, but not by way of limitation, various implementations discussed in the present disclosure. Reference symbols shown in one drawing may not be repeated for the same, and/or similar elements in the same view, or in related views. Reference symbols that are repeated in multiple drawings may not be specifically discussed with respect to each of those drawings but are provided for context between related views. Also, not all like elements in the drawings are specifically referenced with a reference symbol when multiple instances of an element are illustrated in a given view.

DETAILED DESCRIPTION

With newer electronic applications (e.g., automotive, or other applications) there can be increasing performance requirements (e.g., size, electrical, thermal, mechanical, reliability and fatigue, external connections, and assembly requirements) on a power modules used to supply power to host electronic applications.

The present disclosure describes a power module that includes a press-fit pin coupler or connector within the power module. The power module may include at least one power device die (e.g., an insulated-gate bipolar transistor (IGBT), a power metal-oxide-semiconductor field-effect transistor (MOSFET), etc.) encapsulated in a housing or body made of a molding material (e.g., epoxy molding compound (EMC)). The power device die may be electrically connected to a leadframe that extends through the mold body to the outside of the housing to form, for example, an external power terminal or external ground terminal of the power module.

The press-fit pin coupler or connector (hereinafter press-fit pin coupler) is disposed in, or across, an opening in the mold body (e.g., across a through mold via (TMV) in the mold body). The press-fit pin coupler can include a press-fit pin receiver hole configured to receive an end of at least a press-fit pin through the opening (TMV) in the mold body and to electrically connect the press-fit pin to the power device die. The press-fit pin receiver hole is not covered by mold material but is exposed to the environment outside the mold body in the TMV and is physically accessible from outside the mold body freely through the TMV. The press-fit pin may form, for example, a signal lead, a power lead, or other connection terminal (e.g., a motor connection terminal) of the power module.

The press-fit pin may, for example, include a shaft (e.g., a cylindrical shaft) with a first end. The first end may have dimensions that are the same as, or larger than, the dimensions of the press-fit pin receiver hole to cause a friction fit or an interference fit when the first end of the press-fit pin is inserted in the hole. In some implementations, the press-fit pin may be a double-sided press-fit pin with a first end and a second end. The first end can be received in the press-fit pin coupler of the power module to electrically connect the press-fit pin to the power device die and the second end can used to connect the power module to (or to mount the power module on) a substrate (e.g., a printed circuit board) of a host electronics application (e.g., an automotive circuit application).

The use of the press-fit pins with the press-fit pin coupler can enable reliable, solder-less mounting of the power module on the substrate of the host electronics application while reducing, for example, a risk of stress-induced mechanical damage (e.g., cracking) of the epoxy molding compound used to encapsulate the semiconductor device dies in the power module.

In example implementations, the press-fit pin coupler may be a resilient substrate or board (e.g., a printed circuit board) with at least one plated-through hole (PTH) through it. The at least one plated-through hole (PTH) can be adapted to receive a press-fit pin to establish electrical connection with a lead frame in the power module. The insertion (or withdrawal) of the press-fit pin in the PTH can cause mechanical stress (insertion stress). The resilience of the substrate or board may help prevent or reduce propagation of the pin-insertion induced stress through the mold body of the power module and thus reduce the risk of cracks or other damage to the mold body of the power module.

Figure 1B:
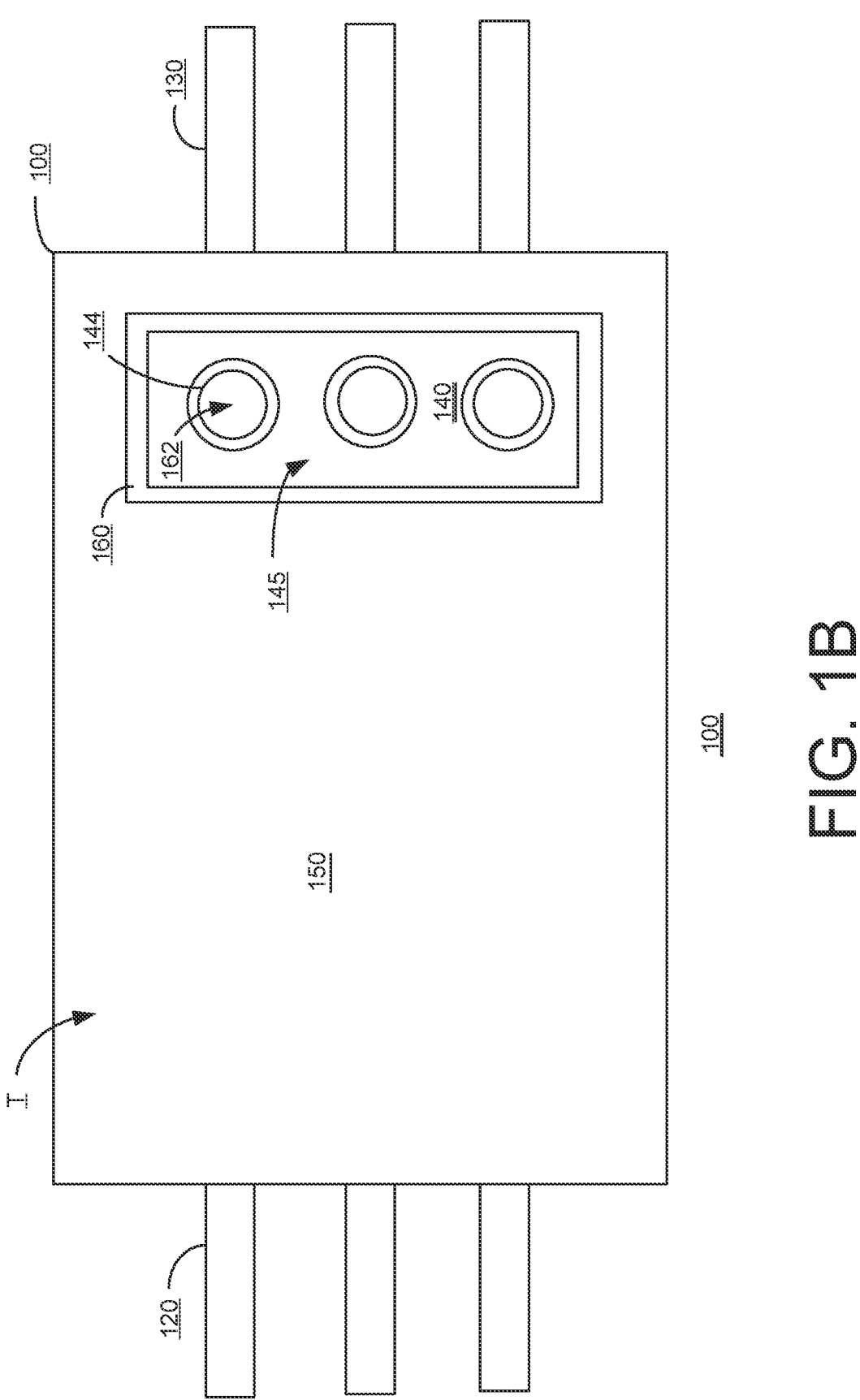
FIG. 1B illustrates, in a top view, the power module of FIG. 1A.
Figure 1C:
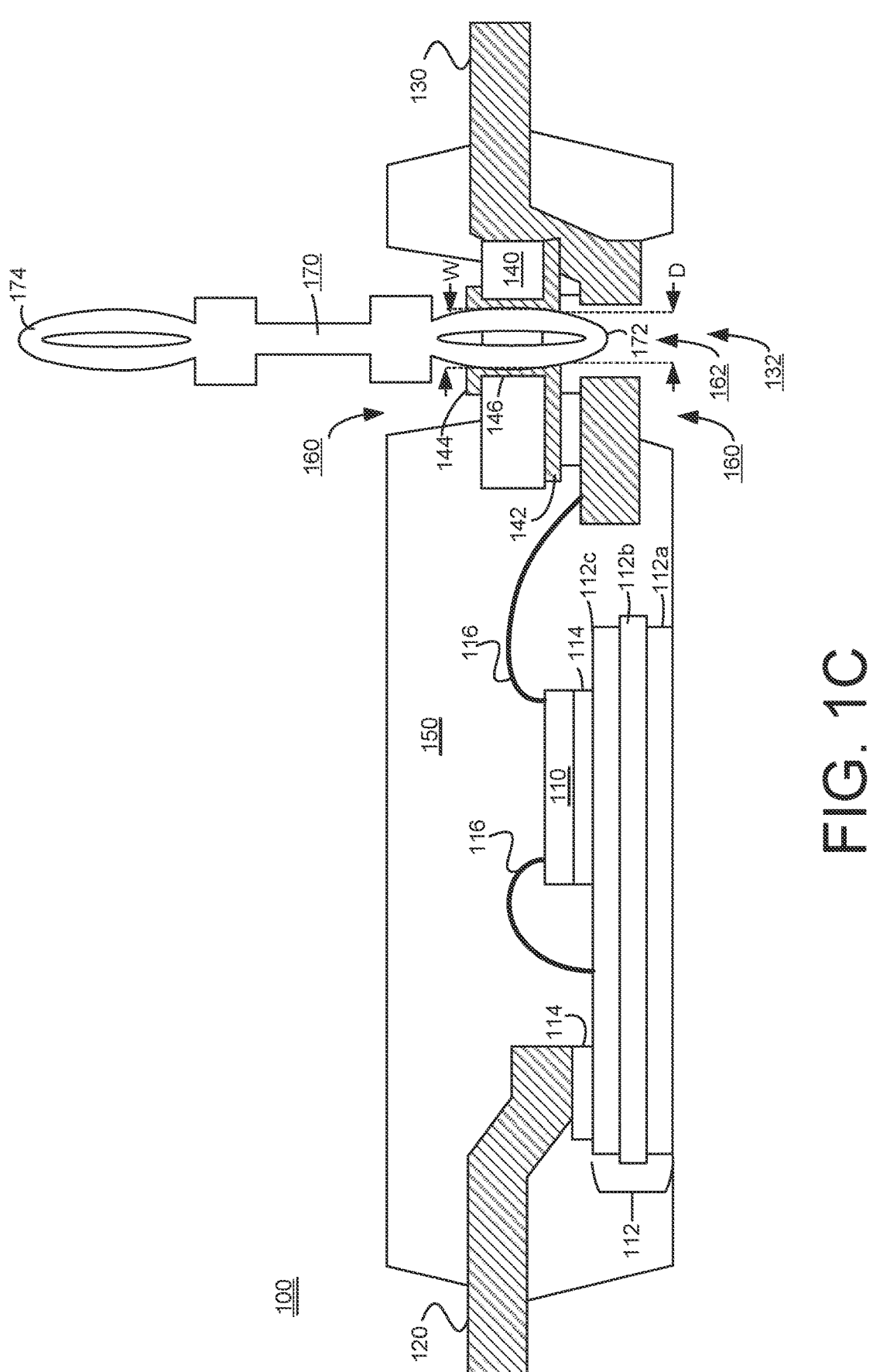
FIG. 1C illustrates, in a cross-sectional view, the power module of FIG. 1A with a press-fit pin inserted in the press-fit pin coupler.

FIG. 1A and FIG. 1B show a cross-sectional view and a top view, respectively, of an example power module 100 that includes a press-fit pin coupler 145, in accordance with the principles of the present disclosure. FIG. 1C show of cross-sectional view of power module 100 with a press-fit pin (e.g., press-fit pin 170) inserted in press-fit pin coupler 145.

Power module 100 may include, for example, at least a semiconductor device die 110 encapsulated in a mold body 150. Power module 100 may further include, for example, at least a pair of lead frames (e.g., lead frame 120 and lead frame 130) that can be connected to semiconductor device die 110 and extend out of the mold body as external terminals of the power module 100. Lead frame 130 may include for example, two portions (e.g., lead frame portion 130*a* and lead frame portion 130*b*) that are separated by a through mold via (TMV) (e.g., TMV 160). TMV 160 may, for example, extend from a top surface T to a bottom surface B of mold body 150.

In example implementations, semiconductor device die 110 (e.g., a power device) may be disposed on a substrate 112 (e.g., a double-bonded metal (DBM) substrate). Substrate 112 may, for example, include a thermally conductive ceramic tile 112*b* disposed between electrically conductive layer 112*c* and electrically conductive layer 112*a* (e.g., metal layers). Semiconductor device die 100 and lead frame 120 may be attached to electrically conductive layer 112*c* by adhesive layers (e.g., a first adhesive layer 114 and a second adhesive layer 114, respectively) (e.g., a solder or a conductive epoxy). Further, wire bonds (e.g., wire bond 116) may connect semiconductor device die 100 to electrically conductive layer 112*c* and to a portion (e.g., lead frame portion 130*a*) of lead frame 130.

As shown, for example, in FIGS. 1A, 1B and 1C, press-fit pin coupler 145 may be disposed across TMV 160. Press-fit pin coupler 145 may include a resilient substrate or board (e.g., a printed circuit board) (e.g., board 140) with at least one plated-through hole (PTH) (e.g., hole 162) through it. Hole 162 may, for example, have a diameter D. The PTH (e.g., hole 162) is not covered by mold material, but is exposed to the environment (ambient) outside the mold body in TMV 160 and is physically accessible from outside the mold body through the TMV. The at least one plated-through hole (PTH) (e.g., hole 162) can be adapted to receive a press-fit pin (e.g., press-fit pin 170, FIG. 1C). The press-fit pin may form, for example, a signal lead, a power lead, or other connection terminal (e.g., a motor connection terminal) of the power module.

In example implementations, press-fit pin coupler 145/board 140 may be a flat laminated composite made from non-conductive substrate materials (e.g., fiberglass, plastic, or epoxy resin materials). A metal layer (e.g., copper or copper alloy) may be disposed on top surface (e.g., surface tb) of board 140 surrounding hole 162, sidewalls (e.g., sidewalls sw) of hole 162, and a bottom surface (e.g., surface tb) of board 140 surrounding hole 162. For example, metal layer 142 may be plated or deposited on surface bb of board 140, metal layer 144 may be plated or deposited on surface tb of board 140, and metal layer 146 may be plated or deposited on sidewalls sw of hole 162 in board 140. In example implementations, some of the metal layers disposed on board 140 may be attached to lead frame 130. For example, metal layer 142 on the bottom surface (e.g., surface tb) of board 140 surrounding hole 162 may be attached by a conductive layer (e.g., a solder or a conductive epoxy) to lead frame portion 130*a* (on a left-side L of hole 162) and lead frame portion 130*b* (on a right-side R of hole 162).

In example implementations, power module 100 may include several lead frames (e.g., lead frame 120 and lead frame 130) that can be connected to semiconductor device die 110 and extend out of the mold body as external terminals of the power module 100. Correspondingly, press-fit pin coupler 145/board 140 may include several plated-through holes (PTH) (e.g., hole 162) adapted to press-fit pins (e.g., press-fit pin 170, FIG. 1C) to form several signal leads or power leads of power module 100 electrically connected to the several lead frames. In some implementations, the several plated-through holes (PTH) (e.g., hole 162) may be aligned with corresponding cuts, holes, or openings (e.g., opening 132) in lead frame 130. FIG. 1B shows, for example, press-fit pin coupler 145/board 140 disposed in TMV 160 with several (e.g., three) plated-through holes (PTH) (e.g., hole 162) that are adapted to receive press-fit pins.

In example implementations, press-fit pin coupler 145/ board 140 is disposed above lead frame 130 (in the y direction, FIG. 1A) and hole 162 may be aligned with a cut, hole or opening (e.g., opening 132) in lead frame 130.

A press-fit pin (e.g., press-fit pin 170, FIG. 1C) inserted in hole 162 may form a signal lead or a power lead of power module 100. The press-fit pin 170 is electrically connected to lead frame 130 by the press-fit (i.e., mechanical contact) with metal layer 146 plated or deposited on sidewalls sw of hole 162 in board 140.

FIG. 1C shows, for example, a press-fit pin (e.g., press-fit pin 170) inserted in hole 162 of board 140 to form a signal lead or a power lead of power module 100. Press-fit pin 170 may, for example, be made of a metal or metal alloy (e.g., brass, copper, copper telluride, etc.). Press-fit pin 170 may, for example, be a double-sided press-fit pin with a first end 172 and a second end 174. The two ends (e.g., first end 172 and second end 174) may, for example, be structures that have a compressible width. For example, first end 172 may be an eye-of-needle style structure that has a (compressible) width W. Width W may be the same as (or slightly larger than) the diameter D of the plated-through holes (PTH) (e.g., hole 162). Insertion of first end 172 tightly in the slightly small hole (e.g., hole 162) can result in a press-fit (also known as interference fit or friction fit) fastening of press-fit pin 170 and metal layer 146 plated or deposited on sidewalls sw of hole 162 in board 140. This fastening of the first end 172 and metal layer 146, which is solder-less, may be achieved by normal force, friction, and cold welding of the surfaces in contact.

Figure 6:
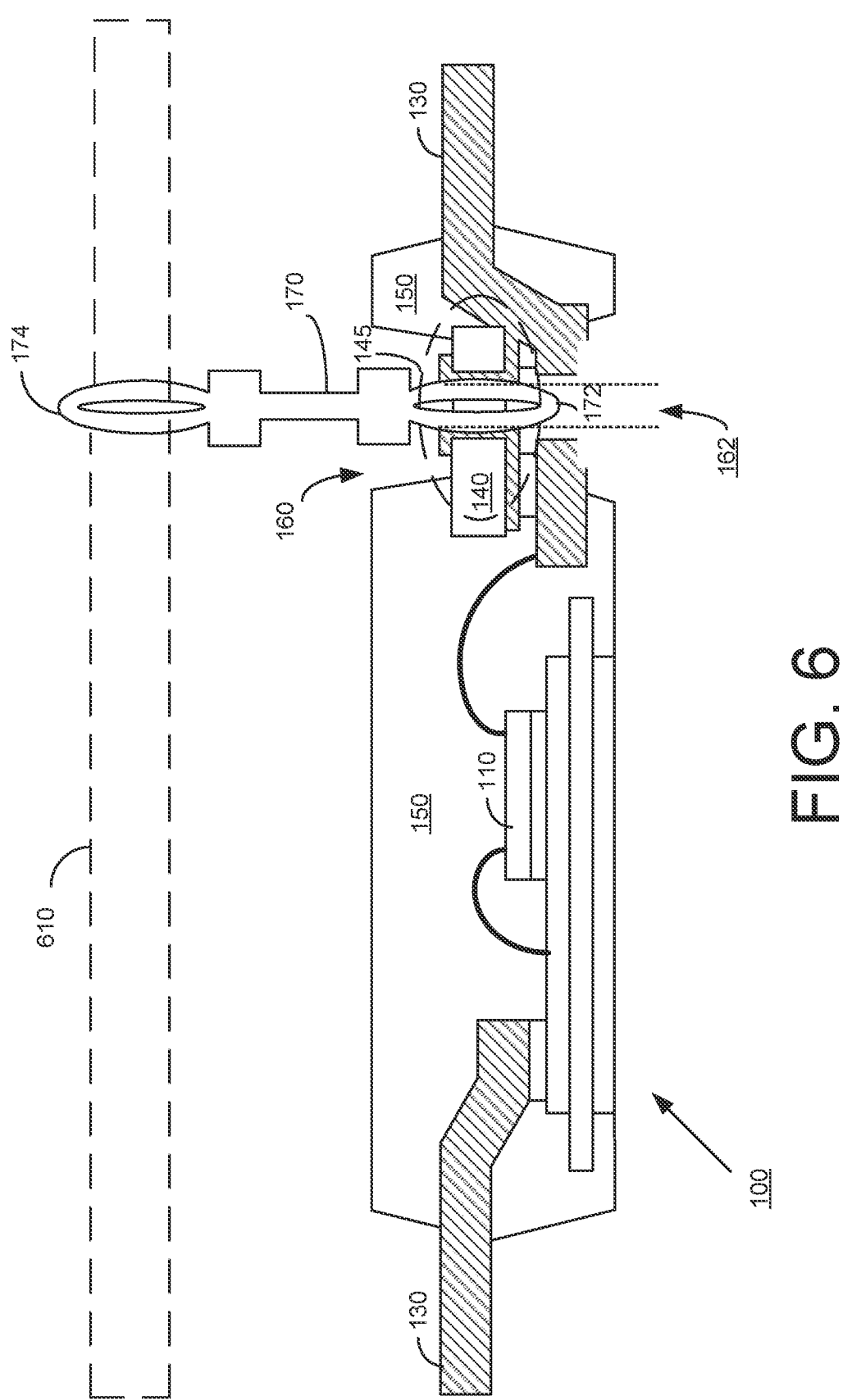
FIG. 6 schematically illustrates a power module attached to an external substrate.

In example implementations, the second ends (e.g., second end 174) of the press-fit pins (e.g., press-fit pin 170, FIG. 1C) may be used to mount (e.g., press-fit) power module 100 on a substrate (e.g., a printed circuit board) of a host electronics application (e.g., an automotive circuit application) (FIG. 6).

Figure 2B:
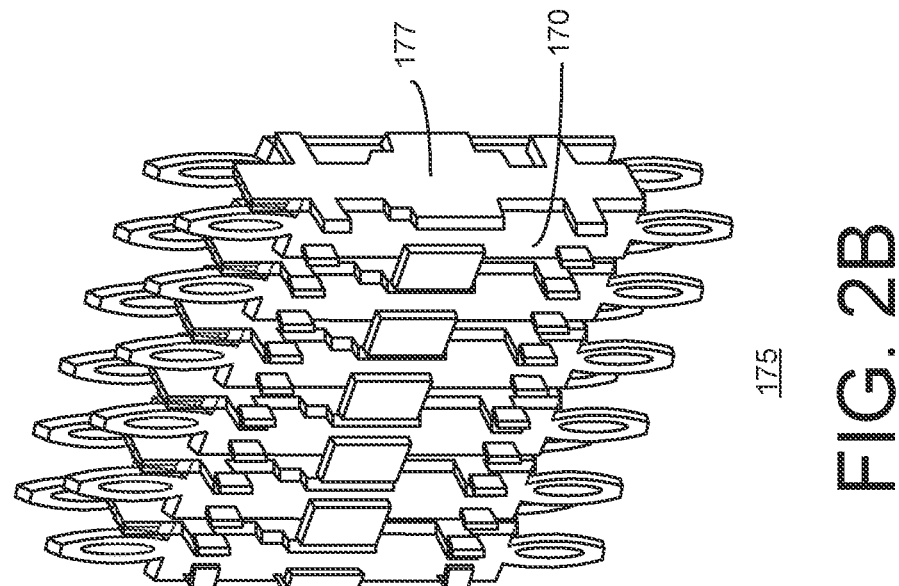
FIGS. 2A and 2B illustrate an individual press-fit pin and a set of press-fit pins in package, respectively.
Figure 2A:
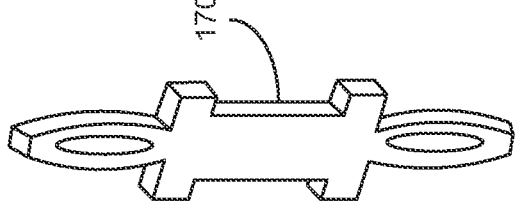

In some example implementations, the assembly of press-fit pins in press-fit pin coupler 145/board 140 may be accomplished inserting individual single pins (e.g., individual double-sided press-fit pins) one-by-one in the several plated-through holes (PTH) (e.g., hole 162) in board 140 (FIG. 1B). FIG. 2A shows, for example, an individual single press-fit pin (e.g., press-fit pin 170). In some other example implementations, the assembly of press-fit pins in press-fit pin coupler 145/board 140 may be accomplished by inserting multiple press-fit pins simultaneously in the several plated-through holes (PTH) (e.g., hole 162) in board 140. FIG. 2B shows, for example, a set of multiple press fit pins (e.g., press-fit pin 170) in a housing 175 that may be inserted simultaneously in the several plated-through holes (PTH) (e.g., hole 162) in board 140. In example implementations, housing 175 may be made of plastic (e.g., plastic 177).

FIG. 3 shows an example method 300 for assembling a power module with a press-fit pin as an external signal or power lead. Method 300 includes forming an assembly of power module components (310). The assembly of the power module components includes a semiconductor device die, at least a lead frame connected to the semiconductor device die, and a board (substrate) connected to the lead frame. The board (e.g., a PCB) may be made of resilient material. The board includes a plated-through hole (PTH). Method 300 further includes encapsulating the assembly in a mold body with a through-mold via (TMV) aligned with an opening in the lead frame and a portion of the board including the plated-through hole (PTH) (320). The PTH is not covered by mold material but is exposed to the environment (ambient) in the TMV and is physically accessible from outside the mold body through the TMV. Method 300 further includes press-fitting a press-fit pin in the PTH through the TMV (330). The press-fit pin (made of metal or a metal alloy) is electrically connected to the lead frame by the press-fitting and can form an external signal or power lead of the power module.

FIG. 4 shows an example method 400 for assembling a power module with press-fit pins as external signal or power leads.

Method 400 includes disposing a semiconductor power device on a first adhesive layer on a substrate (410) and disposing the substrate with the semiconductor power device on it on a jig (e.g., a soldering jig) (420). The power semiconductor power device may, for example, be an IGBT or a MOSFET device. The substrate may, for example, be a direct bonded copper (DBC) substrate, a direct bonded metal (DBM) substrate, an active metal brazed (AMB) substrate, an insulated metal substrate (IMS), or a ceramic substrate, etc. The first adhesive layer may, for example, be a solder material (e.g., a solder preform, solder paste, etc.).

Method 300 further includes disposing a first lead frame on a second adhesive layer on the substrate with the semiconductor power device disposed on the jig (430) and disposing a second lead frame on the jig (440). The second lead frame may include a cut, hole, or opening through it. Method 300 further includes disposing a board (e.g., a PCB substrate) on a third adhesive layer on the second lead frame (450). The board has a through hole (e.g., a plated-through hole (PTH)) in it. The board may have a metal layer deposited on a top surface, and a bottom surface, and on sidewalls of the through hole in the board. The board may be disposed on the second lead frame with the through hole aligned with the cut, hole, or opening in the second lead frame under the board.

Method 400 may further include applying heat to the assembly on the jig to reflow solder in the first, second and third adhesive layers (460). The solder reflow may bond the semiconductor device die to the substrate; the first lead frame to the substrate and the board with the through it to the second lead frame. The method may further include wire bonding the semiconductor device die to the substrate and to the second lead frame.

Method 400 may further include removing the assembly from the jig and placing the assembly to a molding cavity for encapsulation (470). The mold cavity may be shaped to encapsulate the assembly in a mold body with a through-mold via (TMV). A portion of the board including the plated-through hole (e.g., PTH) is aligned with the TMV so that PTH is accessible through the TMV (after removing the molded body from the molding cavity). Method 400 includes after encapsulating the assembly in a mold body with a through mold via (TMV), press-fitting a press-fit pin in a plated-through hole (PTH) in the board through the TMV (480). An example, press-fit pin may include a shaft with a first end. The first end may have dimensions for a press-fit (e.g., a friction or interference fit) when the first end is inserted in the plated-through hole (e.g., PTH). The press-fitted pin is electrically connected to the semiconductor power device in the power module by the press-fit and may form a signal lead or a power lead of the power module.

In example implementations, the press-fit pin may have a second end (distal end) on the shaft of the press-fit pin opposite the first end inserted in the plated-through hole. The second end may be coupled to a substrate (e.g., a PCB) of a host electronics application (e.g., an automotive application) that is supplied, for example, with power by the power module.

FIGS. 5A through 5G schematically illustrate a power module (e.g., power module 100) having press-fit signal or power leads at different stages of construction or after the different steps of method 400 for fabricating the power module. FIGS. 5A through 5G show cross-sectional views of the power module at the different stages of construction.

Figure 5A:
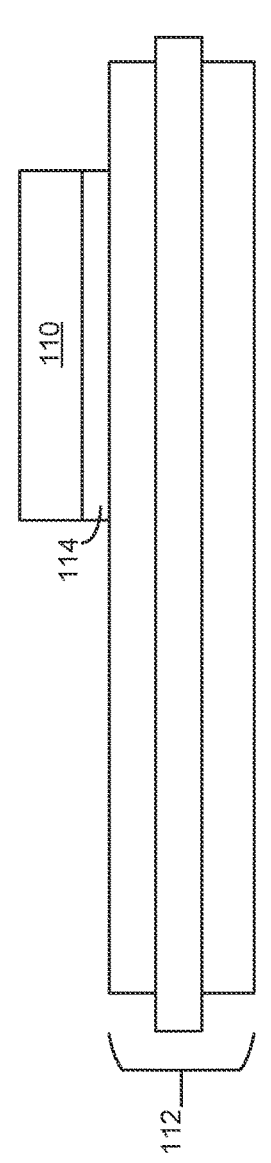
FIGS. 5A through 5G schematically illustrate a power module at different stages of construction.

FIG. 5A shows an example semiconductor device die 110 disposed on a substrate 112 (e.g., a DBM substrate) at a first stage of construction. Semiconductor device die 110 may be placed on an adhesive layer (e.g., first adhesive layer 114) (e.g., a solder preform, or solder paste, etc.) disposed on substrate 112.

Figure 5B:
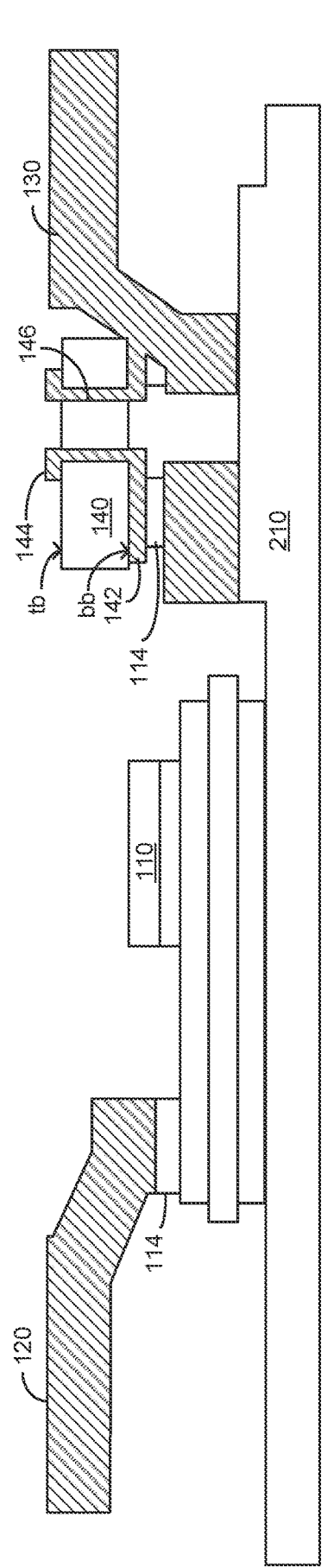

FIG. 5B shows, at a second stage of construction, substrate 112 with the semiconductor device die disposed thereon, lead frames (e.g., lead frame 120, lead frame 130), and board 140 with at least one plated-through hole (PTH) (e.g., hole 162) through it, are placed on a jig 210 (e.g., a soldering jig). Lead frame 120 may be placed on an adhesive layer (e.g., a second adhesive layer 114) (e.g., a solder) on substrate 112. Board 140 may include at least one plated-through hole (e.g., hole 162). Board 140 may further include metal layers (e.g., metal layer 142, metal layer 144) disposed on a top surface tb and a bottom surface bb of board 140, and metal layer 146 disposed on sidewalls (e.g., sidewalls sw) of hole 162. The bottom surface metal layer (e.g., metal layer 144) of board 140 is placed on an adhesive layer (e.g., layer 114) (e.g., a solder preform, or solder paste, etc.) disposed on lead frame 130.

Figure 5C:
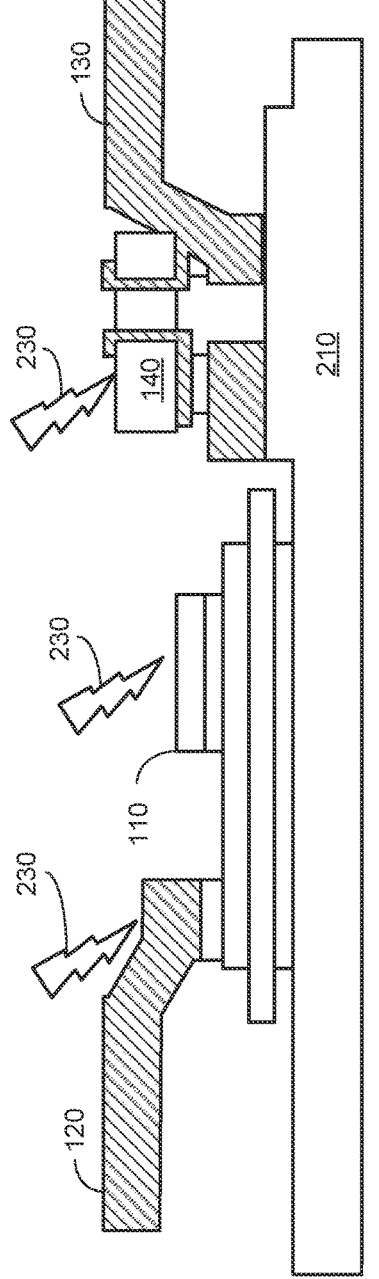

FIG. 5C shows, at a third stage of construction, heat (heat 230) may be applied to the assembly for solder reflow of the various adhesive layers (e.g., the first adhesive layer 114 between semiconductor device die 110 and substrate 112, the second adhesive layer 114 between substrate 112 and lead frame 120, and the third adhesive layer 114 between lead frame 130 and board 140).

Figure 5D:
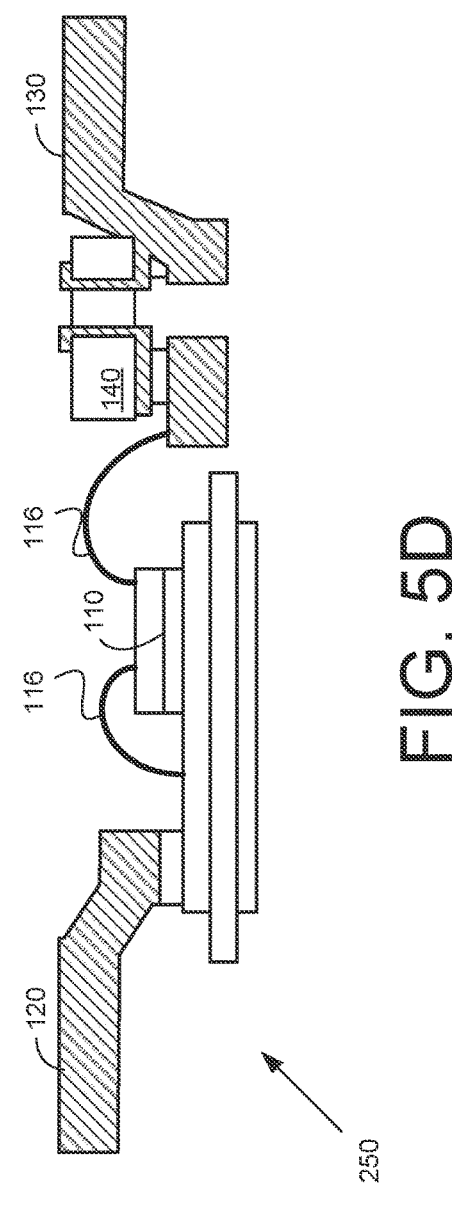

Further, wire bonds (wire bond 116) can be made connecting semiconductor device die 110 to substrate 112 and lead frame 130. At a fourth stage of construction, as shown in FIG. 5D, the jig 210 (e.g., the soldering jig) may be removed to release an assembly (e.g., an unmolded assembly 250) including semiconductor device die 110 attached (soldered) to substrate 112, substrate 112 attached (soldered) to lead frame 120, and board 140 attached (soldered) to lead frame 130.

Figure 5E:
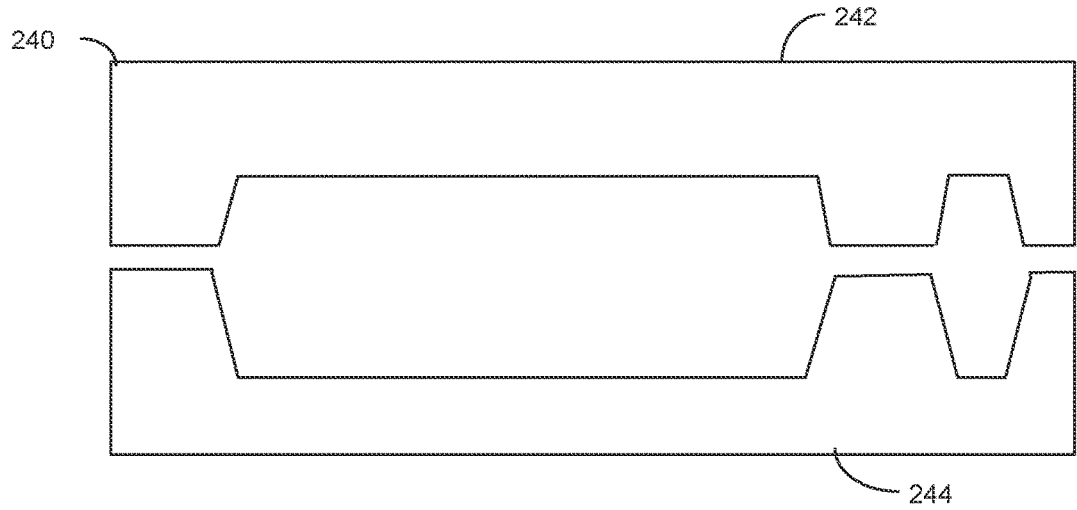

At a fifth stage of construction, the unmolded assembly 250 is placed in a mold cavity (e.g., mold cavity 240). As shown in FIG. 5E, mold cavity 240 may, for example, have a clam-shell form including a cavity top form 242 and a cavity bottom form 244 to enclose portions the unmolded assembly 250. Mold cavity 240 may have a shape that forms a mold body (e.g., mold body 150) that includes a through mold via (e.g., TMV 160) aligned with the at least one plated-through hole (e.g., hole 162) in board 40 and opening 132 in lead frame 130.

Figure 5F:
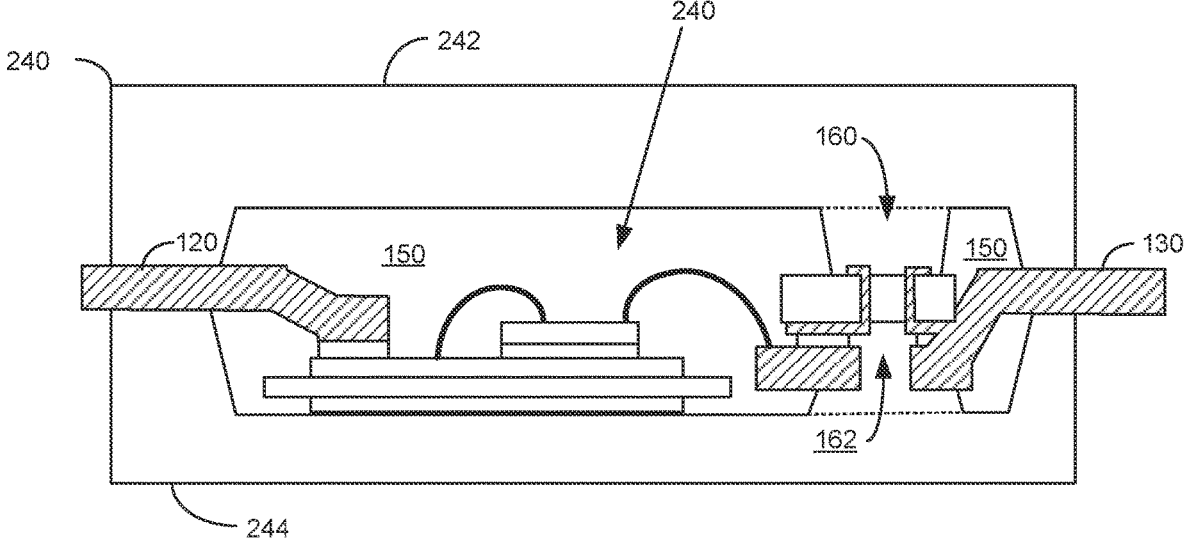

FIG. 5F shows the unmolded assembly 250 placed and encapsulated in mold body 150 in mold cavity 240.

Figure 5G:
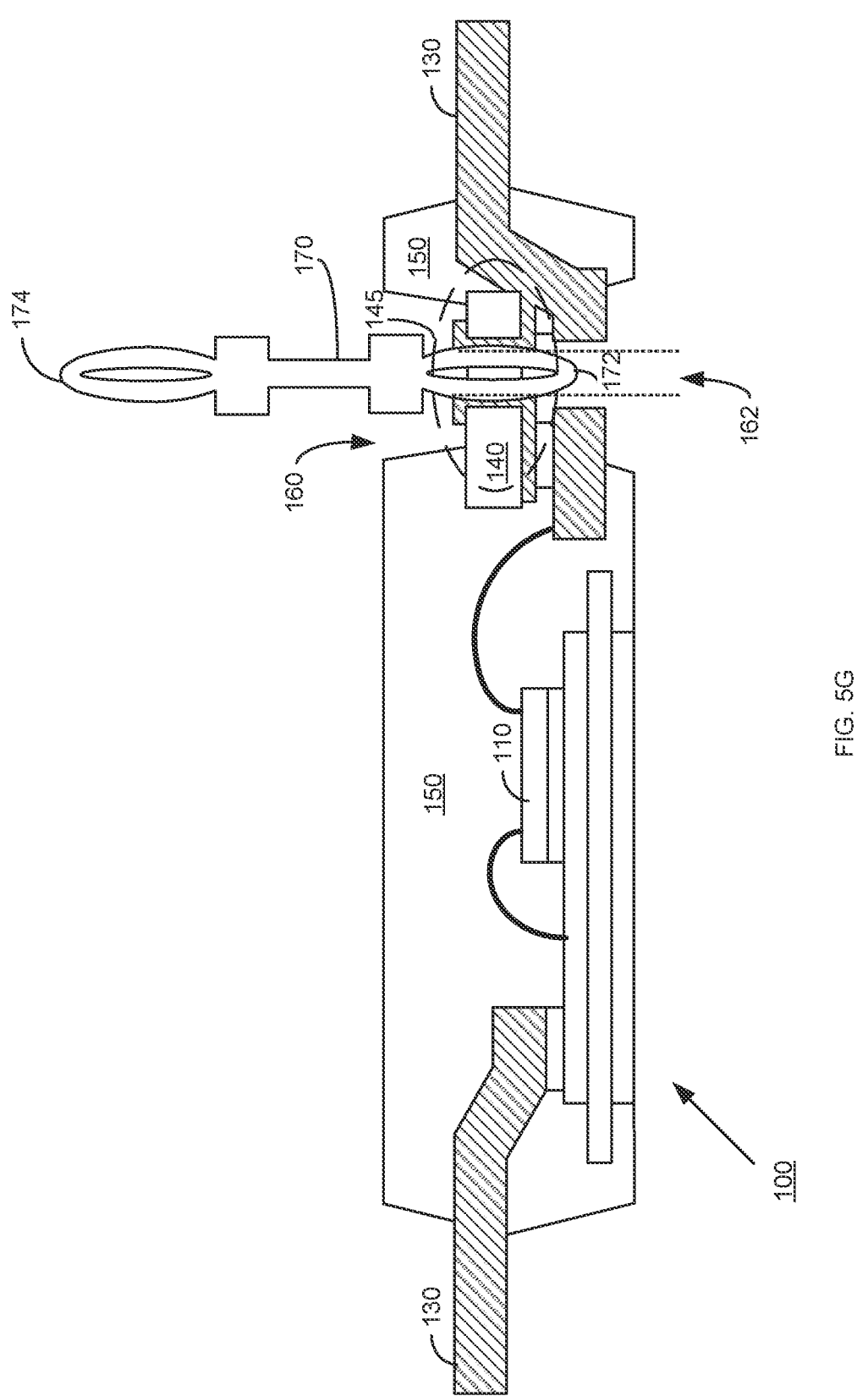

At a sixth stage of construction, as shown in FIG. 5G, the molded assembly (e.g., power module 100 encapsulated in mold body 150) may be taken out of mold cavity 240. Power module 100 encapsulated in mold body 150 includes press-fit pin coupler 145/board 140 having PTHs (e.g., hole 162) adapted to receive press-fit pins for signal or power leads. As shown in FIG. 5G, for example, a press-fit pin 170 can be inserted in hole 162 of board 140 to form a signal lead or a power lead of power module 100.

Figure 5H:
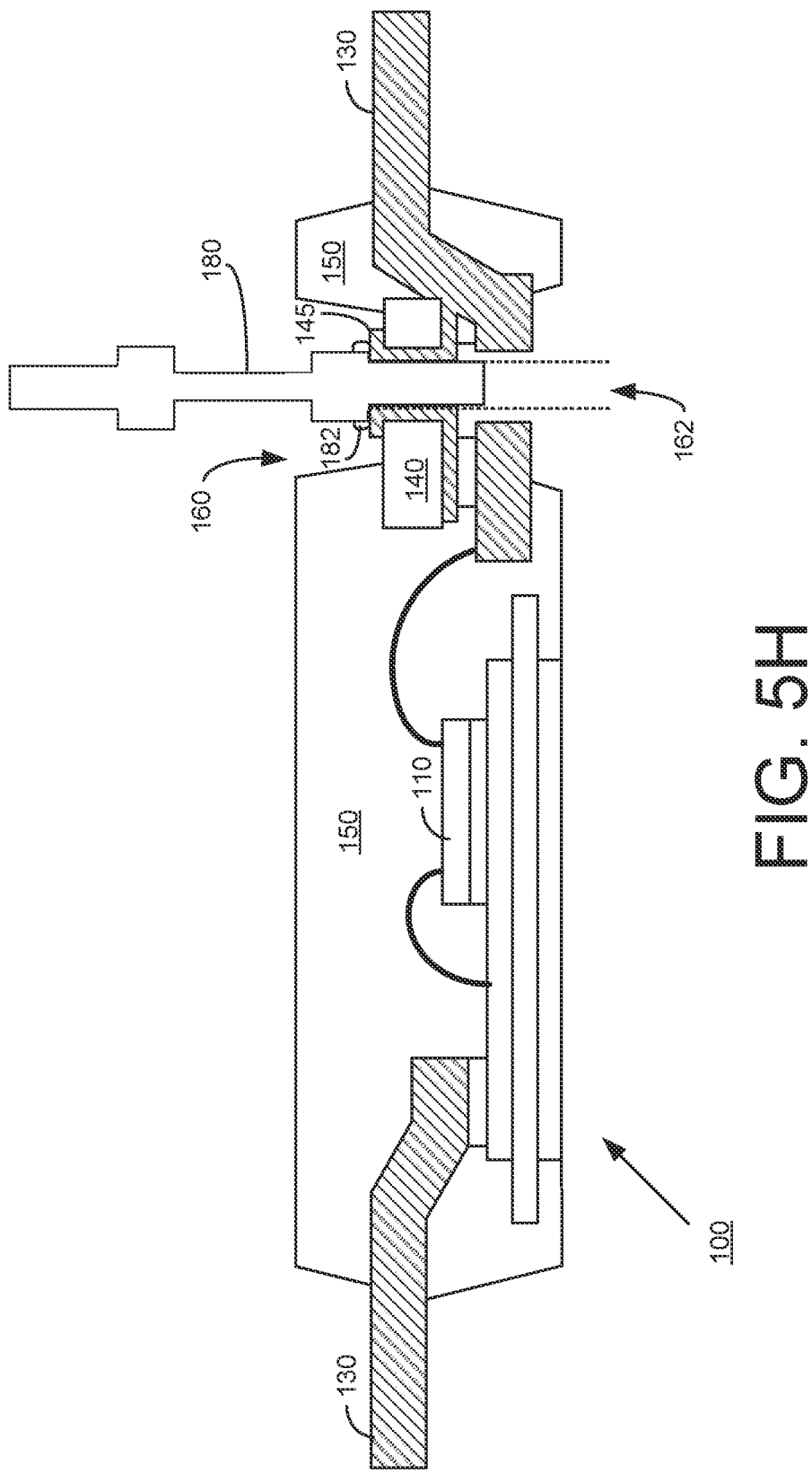
FIG. 5H illustrates an example pin disposed in a through mold via (TMV) to form a signal lead or a power lead of a power module.

In some example implementations, a pin may be disposed in the TMV and attached to a portion of the substrate lead frame in the TMV using one of a solder, an adhesive or an interference fit. FIG. 5H shows, for example, an example pin 180 disposed in TMV 160 and connected to the substrate lead frame (via board 140) to form a signal lead or a power lead of power module 100. Pin 180 may not be a press-fit pin. Pin 180 may be attached to board 140, for example, using, an adhesive or solder (e.g., solder 182) or by an interference fit in hole 162.

In example implementations, power module 100 with the press-fit pins (e.g., pin 170) may be coupled to an external substrate (e.g., a printed circuit board (PCB) of a host power electronics circuit. FIG. 6 schematically illustrates power module 100 attached to an external substrate (e.g., PCB 610). In power module 100, the first end (e.g., first end 172) of press-fit pin (170 is coupled to the power module in press-fit pin coupler 145. The second end (e.g., second end 174) of press-fit pin 170 may be press-fit in a socket (not shown) or a plated-through hole (not shown) or soldered to a trace (not shown) in PCB 610.

In the examples described in the foregoing (e.g., in FIG. 1A through FIG. 1C. FIG. 5A through FIG. 5H, FIG. 6, etc.), example power module 100 includes at least a pair of lead frames (e.g., lead frame 120 and lead frame 130) that can be connected to semiconductor device die 110 and extend out of the mold body as external terminals of the power module 100. The two lead frames are disposed on opposite sides of the power module (e.g., lead frame 120 is disposed on the left side, and lead frame 130 is disposed on a right side in FIG. 1A).

Lead frame 130 (disposed on the right side in the figures) includes, for example, two portions (e.g., lead frame portion 130a and lead frame portion 130b) that are separated (as seen in the cross-sectional view presented in the FIG. 1A) by a through mold via (TMV) (e.g., TMV 160). Press-fit pin coupler 145 including a resilient substrate or board (e.g., a printed circuit board) (e.g., board 140) is disposed across TMV 160 to couple the two lead frame portions (e.g., lead frame portion 130a and lead frame portion 130b) using a pin (e.g., press-fit pin 170, FIG. 1C, or pin 180, FIG. 5H) received in hole 162 in the press-fit pin coupler. In example implementations, press-fit pin coupler 145/board 140 is disposed above lead frame 130 (in the y direction, FIG. 1A).

A customer using power module 100 to power a customer machine or device may use, for example, press-fit pins 170 received in press-fit pin coupler 145 across TMV 160 to couple the signal input/out lead frame (e.g., lead frame 130) to signal input/out terminals of the customer machine of device.

In the example power module 100 shown in FIG. 1A, unlike lead frame 130, lead frame 120 does not include a resilient substrate or board (e.g., a printed circuit board) (e.g., board 140) with a PTH. Lead frame 120 (e.g., a power lead frame) has a single unitary structure with an end soldered to substrate 112 encapsulated in a mold body 150 of the power module. The customer using power module 100 to power the customer machine or device may have to weld or screw the power lead frame (e.g., lead frame 120) to a power terminal of the customer machine of device.

In some example implementations of a power module (e.g., power module 700, FIG. 7) both lead frames (e.g., lead frame 120 and lead frame 130) may each include a resilient substrate of a press-fit pin coupler across a respective TMV in the mold body (e.g., mold body 150) of the power module.

In cross sectional views, each lead frame includes portions that are coupled by the press-fit pin coupler included in the lead frame.

Figure 7:
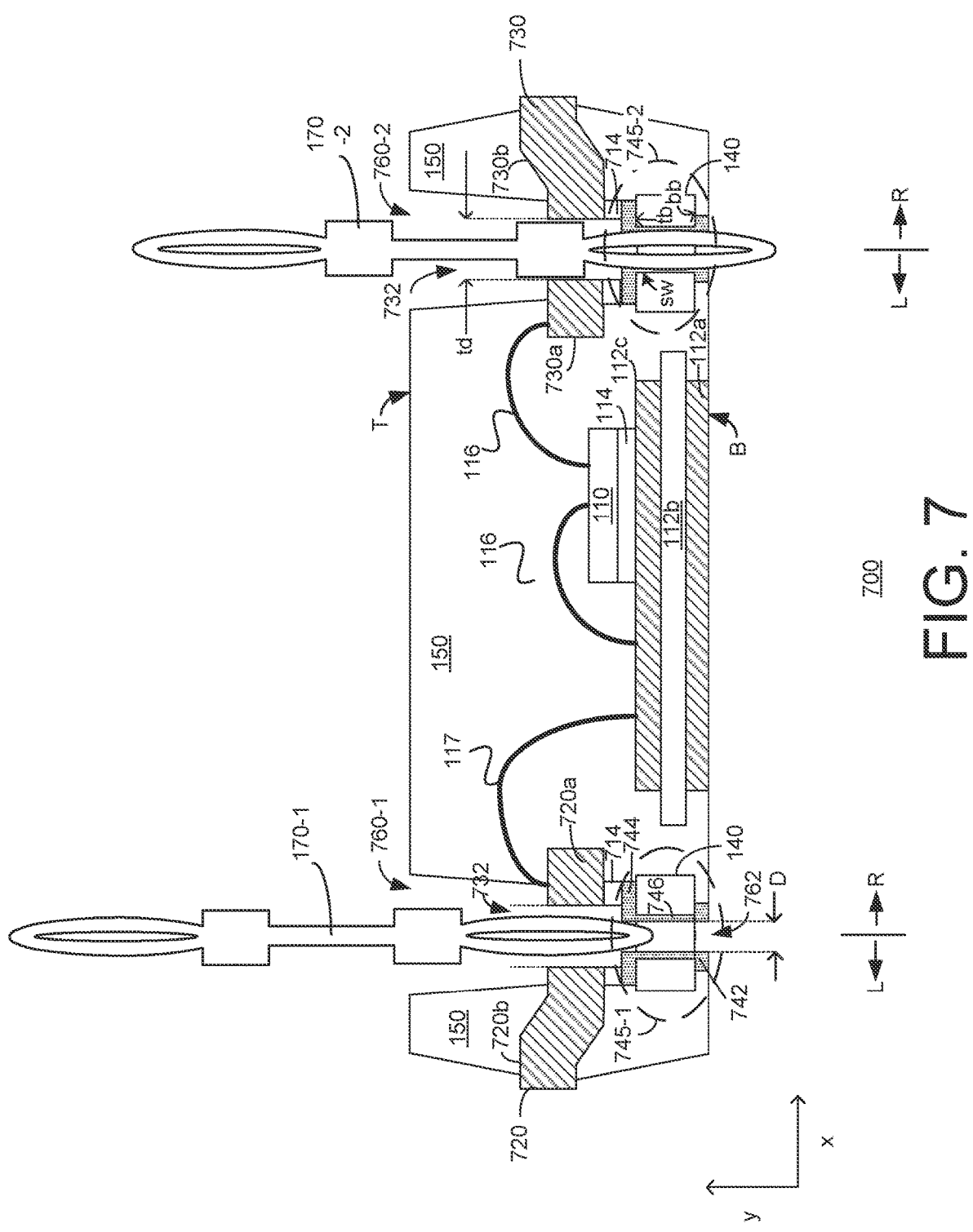
FIG. 7 illustrates, in a cross-sectional view, a power module including press-fit pin couplers for a pair of lead frames extending from two sides of the power module.

FIG. 7 illustrates, in a cross-sectional view, a power module 700 including press-fit pin couplers disposed below the lead frames extending from the power module on two sides.

Power module 700 (that like power module 100, FIG. 1A) may include, for example, at least a semiconductor device die 110 encapsulated in a mold body 150. Power module 700 may further include, for example, at least a pair of lead frames (e.g., lead frame 720 and lead frame 730) made of metal or a metal alloy. Each of the lead frames includes a cut, hole or opening (e.g., opening 732) in the lead frame. In the cross sectional view shown in FIG. 7, lead frame 720 in a cross-sectional view includes lead frame portion 730a and lead frame portion 720b separated by the cut, hole or opening (e.g., opening 732) in the lead frame, and lead frame 730 includes lead frame portion 730a and lead frame portion 730b in the cross-sectional view separated by the cut, hole or opening (e.g., opening 732) in the lead frame. Mold body 150 encapsulating the power module may include through-mold vias (e.g., TMV 760-1, and TMV 760-2) aligned with the openings (e.g., opening 732) in the lead frames (e.g., lead frame 120 and lead frame 130). Each of TMV 760-1 and TMV 760-2 extends from a top surface T of mold body 150 to a bottom surface B of the mold body.

As shown in FIG. 7, each of the lead frames (e.g., lead frame 720 and lead frame 730) includes a resilient substrate of a respective press-fit pin coupler disposed across the respective TMVs in the mold body (e.g., mold body 150) of the power module. For example, a press-fit pin coupler 745-1 disposed across TMV 760-1 may be attached to lead frame portion 720a and lead frame portion 720b of lead frame 720, and press-fit pin coupler 745-2 disposed across TMV 760-2 may be attached to lead frame portion 730a and lead frame portion 730b of lead frame 730.

In example implementations, the press-fit pin couplers may be disposed below the lead frames. For example, press-fit pin coupler 745-1 may be disposed below lead frame 720 (in the y-direction), and press-fit pin coupler 745-2 may be disposed below lead frame 730 (in the y-direction).

In example implementations, each of the press fit pin couplers (e.g., press-fit pin coupler 745-1, 745-2) may include a resilient substrate or board (e.g., a printed circuit board) (e.g., board 140) with at least one plated-through hole (PTH) (e.g., hole 762) through it (i.e., board 140). Hole 762 may, for example, have a diameter D. The PTH (e.g., hole 762) may be aligned with the lead frame openings (e.g., opening 732) in the respective TMVs. The PTHs are not covered by mold material, but is exposed to the environment (ambient) outside the mold body in the TMVs (e.g., TMV 760-1, TMV 760-2). The PTH are physically accessible from outside the mold body through the TMVs. The at least one plated-through hole (PTH) (e.g., hole 762) can be adapted to receive a pin 170-1 or pin 170-2. Pin 170-1 and pin 170-2 may for example, have eye-of-a-needle style structure (e.g., like press-fit pin 170, FIG. 1C) or, a non-press fit structure (e.g., like pin 180, FIG. 5H). In example implementations, the diameter D of hole 762 may be such that an end of the pin (e.g., press-fit pin 170-1, press-fit pin 170-2, or pin 180) can be press-fit or interference fit in hole 762. The pin (e.g., press-fit pin 170-1, press-fit pin 170-2, or pin 180) fitted in the press-fit pin coupler (e.g., press-fit pin coupler 745-1, 745-2) may electrically connect the respective lead frame portions (e.g., lead frame portion 720a and lead frame portion 720b separated by a TMV 760-1, lead frame portion 730a and 730b separated by TMV 760-2). The pin (e.g., press-fit pin 170-1, press-fit pin 170-2, or pin 180) is electrically connected to the lead frames by the press-fit or interference fit (i.e., mechanical contact) with metal layer 744 plated or deposited on sidewalls sw of hole 762 in board 140. The pin inserted in hole 762 may form, for example, a signal lead, a power lead, or other connection terminal (e.g., a motor connection terminal) of the power module.

In example implementations, press-fit pin coupler 745-1 and press-fit pin coupler 745-2 may each include a flat laminated composite board (e.g., board 140) made from non-conductive substrate materials (e.g., fiberglass, plastic, or epoxy resin materials). A metal layer (e.g., copper or copper alloy) may be disposed on top surface (e.g., surface tb) of board 140 surrounding hole 762, sidewalls (e.g., sidewalls sw) of hole 762, and a bottom surface (e.g., surface bb) of board 140 surrounding hole 762. For example, metal layer 742 may be plated or deposited on surface bb of board 140, metal layer 744 may be plated or deposited on surface tb of board 140, and metal layer 746 may be plated or deposited on sidewalls sw of hole 162 in board 140.

In example implementations, some of the metal layers disposed on board 140 may be attached to the lead frames using conductive adhesive layers. As shown, for example, in FIG. 7, for lead frame 720, metal layer 744 on the top surface (e.g., surface tb) of board 140 surrounding hole 762 may be attached by a conductive layer (e.g., a fourth adhesive layer 714) (e.g., a solder or a conductive epoxy) to lead frame portion 720b (on a left-side L of hole 162) and to lead frame portion 720a (on a right-side R of hole 762). For lead frame 730, metal layer 744 on the top surface (e.g., surface tb) of board 140 surrounding hole 762 may be attached by the conductive layer (e.g., fourth adhesive layer 714) (e.g., a solder or a conductive epoxy) to lead frame portion 730a (on a left-side L of hole 162) and to lead frame portion 730b (on a right-side R of hole 762).

In power module 700, as in power module 100 (FIG. 1A), semiconductor device die 110 (e.g., a power device) may be disposed on a substrate 112 (e.g., a double-bonded metal (DBM) substrate). Substrate 112 may, for example, include a thermally conductive ceramic tile 112b disposed between electrically conductive layer 112c and electrically conductive layer 112a (e.g., metal layers). Semiconductor device die 100 may be attached to electrically conductive layer 112c of substrate 112 by an adhesive layer (e.g., first adhesive layer 114) (e.g., a solder or a conductive epoxy). Further, wire bonds (e.g., wire bond 116) may connect semiconductor device die 110 to electrically conductive layer 112c of substrate 112 and to a portion (e.g., lead frame portion 730a) of lead frame 730. Further, a wire bond (e.g., wire bond 117) may connect electrically conductive layer 112a of substrate 112 to a portion (e.g., lead frame portion 720a) of lead frame 720.

In example implementations, power module 700 (like power module 100, FIG. 1A and FIG. 1B) may include several lead frames (e.g., lead frame 720 and lead frame 730) that can be connected to semiconductor device die 110 and extend out of the mold body as external terminals of the power module 100.

FIG. 8 shows an example method 800 for assembling a power module with a press-fit pin couplers disposed below each of a pair of lead frames extending from opposite sides of the power module as an external signal or external power lead. In some implementations, the press-fit pin couplers may be attached to the lead frames below cuts, holes, or openings in the leads frames (FIG. 7). In some other implementations, the press-fit pin couplers may be attached to the lead frames above the cuts, holes, or openings in the leads frames (FIG. 1A).

Method 800 includes forming an assembly including a semiconductor device die and at least one lead frame connected to the semiconductor die, the at least one lead frame including a substrate, the substrate including at least one plated-through hole (PTH) aligned with an opening in the lead frame (810). The at least one lead frame may be made of metal or metal alloys (e.g., copper). The opening in the lead frame may be a cut or hole in the lead frame. The substrate may be a resilient board (e.g., a PCB) that includes the least one plated-through hole (PTH).

The assembly of the power module components may be assembled on a carrier (e.g., a soldering jig).

Method 800 further includes encapsulating the assembly in a mold body with a through-mold via (TMV) aligned with the opening in the at least one lead frame and aligned with a portion of the substrate including the at least one PTH (820). The at least one PTH in the substrate (e.g., a board) is not covered by mold material but is exposed in the TMV to the environment (ambient) outside the mold body and is physically accessible from outside the mold body through the TMV.

Method 800 further includes fitting a pin in the PTH in the respective substrate through the TMV (830). The pin (made of metal or a metal alloy) is electrically connected to the lead frame, for example, by press-fitting or interference fitting in the PTH, and can form an external signal lead or a power lead of the power module. In some example implementations, a conductive adhesive or solder may be used (instead of press-fitting or interference fitting) to electrically connect the pin to the lead frame.

FIGS. 9A through 9D schematically show cross-sectional views a power module (e.g., power module 700) at different stages of construction.

Figure 9A:
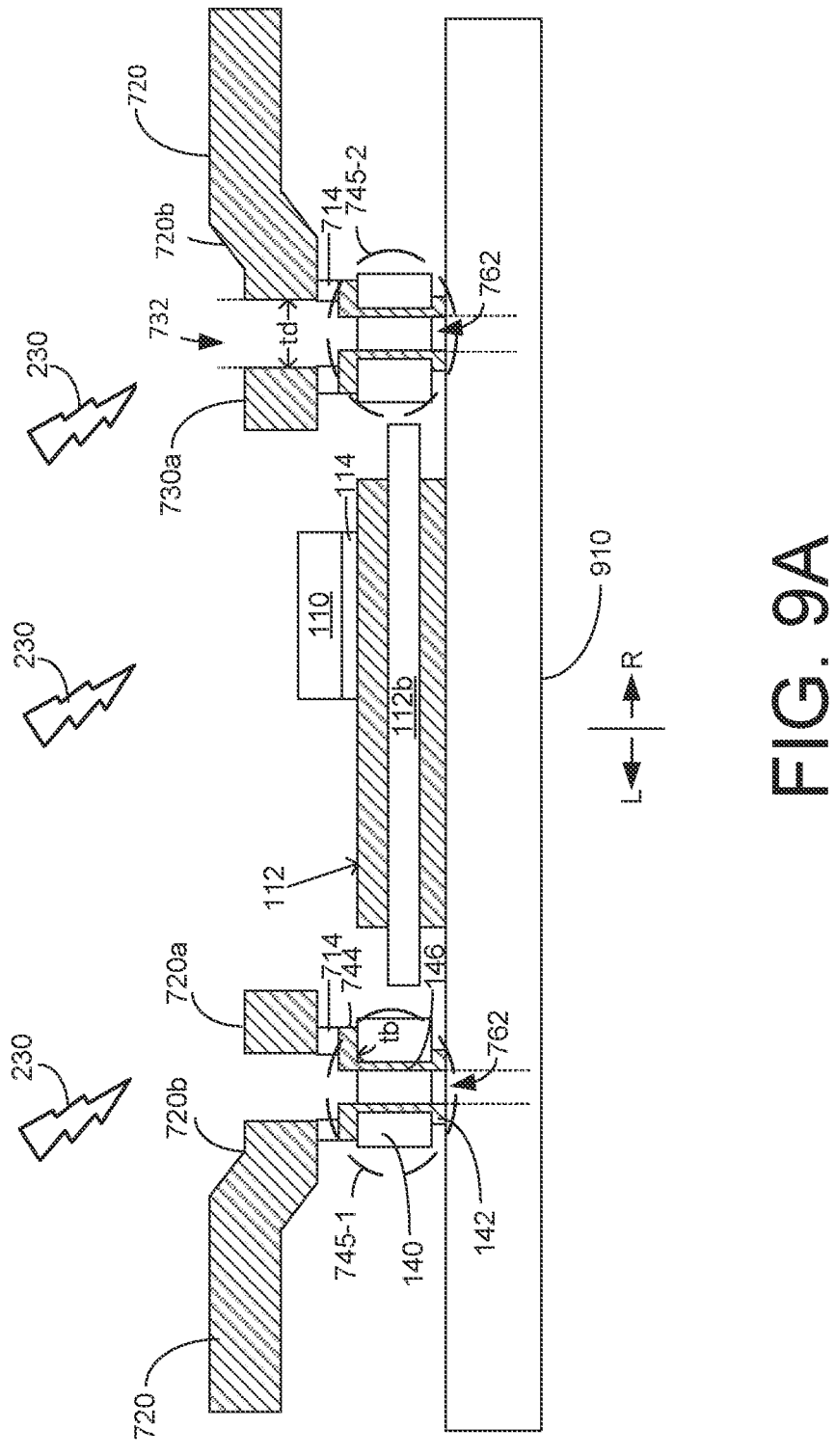
FIGS. 9A through 9D schematically illustrate a power module at various stages of construction.

FIG. 9A shows an assembly of the components of the power module formed, for example, on a carrier (e.g., a soldering jig 910), at a first stage of construction. The power module components include for example, a semiconductor device die 110 mounted on a substrate 112 (e.g., a DBM substrate), two press-fit couplers (e.g., press-fit pin coupler 745-1 and press-fit pin coupler 745-2), lead frame 720, and lead frame 730. The press-fit couplers (e.g., press-fit pin coupler 745-1 and press-fit pin coupler 745-2) may be each prepared with a plated-through hole (e.g., hole 762). These components may be disposed on a carrier (e.g., soldering jig 910). Lead frame 720 and lead frame 730 may each include (in cross-sectional view) two lead frame portions (e.g., lead frame portion 720a and lead frame portion 720b, and lead frame portion 730a and lead frame portion 730b, respectively) that are separated (in cross-sectional view) by an opening (e.g., opening 732) in the frame. The two portions of each lead frame separated by opening 732 may be separated by distance (e.g., a distance td) (in other words, the opening 732 may have a width or diameter td).

As shown in FIG. 9A, semiconductor device die 110 may be placed on an adhesive layer (e.g., first adhesive layer 114) (e.g., a solder preform, or solder paste, etc.) disposed on substrate 112 (disposed on soldering jig 910). The two press-fit couplers (e.g., press-fit pin coupler 745-1 and press-fit pin coupler 745-2) may be placed, for example, to a left (L) and a right (R) of substrate 112 on soldering jig 910. Lead frame 720 (i.e., lead frame portion 720a, and lead frame portion 720b) may be placed above press-fit pin coupler 745-1 and lead frame 730 (i.e., lead frame portion 730a, and lead frame portion 730b) may be placed above press-fit pin coupler 745-2.

Lead frame portion 720a and lead frame portion 720b (of lead frame 720) may positioned on an adhesive layer (e.g., fourth adhesive layer 714) (e.g., a solder preform, or solder paste, etc.) disposed on metal layer 744 on the top surface (e.g., surface tb) of board 140 surrounding the plate-through hole (e.g., hole 762) in press-fit pin coupler 745-1. Similarly, lead frame portion 730a and lead frame portion 730b (of lead frame 730) may positioned on fourth adhesive layer 714 disposed on metal layer 744 on the top surface of board 140 surrounding hole 762 in press-fit pin coupler 745-2.

Heat (heat 230) may be applied to the assembly on soldering jig 910 for solder reflow of the various adhesive layers (e.g., the first adhesive layer 114 between semiconductor device die 110 and substrate 112, the fourth adhesive layer 714 between board 140 in press-fit pin coupler 745-1 and lead frame 720, and fourth adhesive layer 714 between board 140 in press-fit pin coupler 745-2 and lead frame 130).

Next, at a second stage of construction, wire bonds can be made to electrically interconnect the different components of the power module. For example, wire bonds (wire bond 116) can be made to electrically connect semiconductor device die 110 to substrate 112 and to electrically connect semiconductor device die 110 to lead frame 130. Further, a wire bond (e.g., a wire bond 117) can be made to electrically connect substrate 112 to lead frame 120.

Figure 9B:
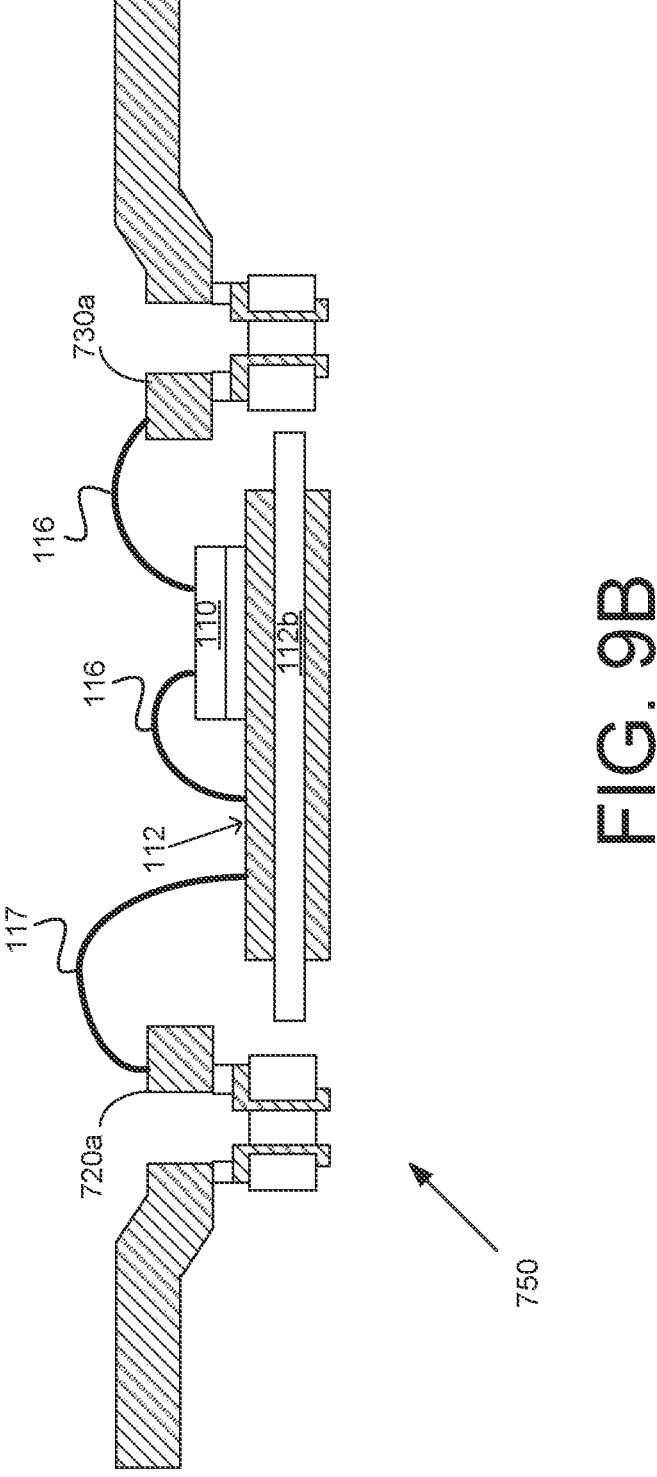

After the wire bonds are made the made, soldering jig 910 may be removed to release an unmolded assembly (e.g., an unmolded assembly 750, FIG. 9B).

As shown in FIG. 9B, unmolded assembly 750 includes semiconductor device die 110 attached (soldered) to substrate 112 and wire bonded to lead frame 130, and substrate 112 wire bonded to lead frame 120. In the unmolded assembly 750, press-fit pin couplers (e.g., press-fit pin coupler 745-1 and press-fit pin coupler 745-2) are disposed below and attached to each of the pair of lead frames (lead frame 720 and lead frame 730, respectively).

Figure 9C:
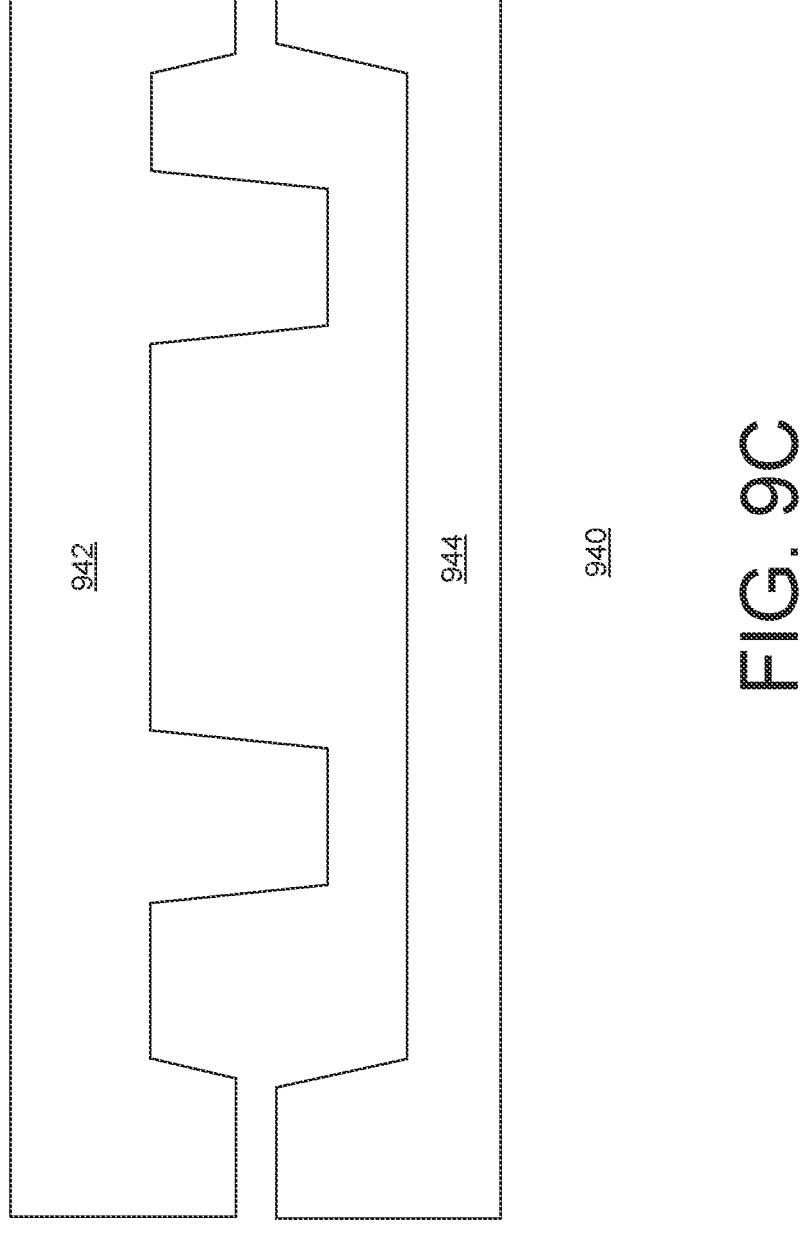

At a third stage of construction, the unmolded assembly 750 is placed in a mold cavity (e.g., mold cavity 940). As shown in FIG. 9C, mold cavity 940 may, for example, have a clam-shell form including a cavity top form 942 and a cavity bottom form 944 to enclose portions the unmolded assembly 750. Mold cavity 940 may have a shape that forms a mold body (e.g., mold body 150) that includes a first through mold via (e.g., TMV 160-1) and a second through mold via (e.g., TMV 160-2.) The first TMV (e.g., TMV 160-1) is aligned with opening 132 in lead frame 120 and with the PTH (e.g., hole 162) in board 40 underneath lead frame 720. The first second TMV (e.g., TMV 160-2 is aligned with opening 132 in lead frame 730 and with the PTH (e.g., hole 162) in board 40 underneath lead frame 730.

Figure 9D:
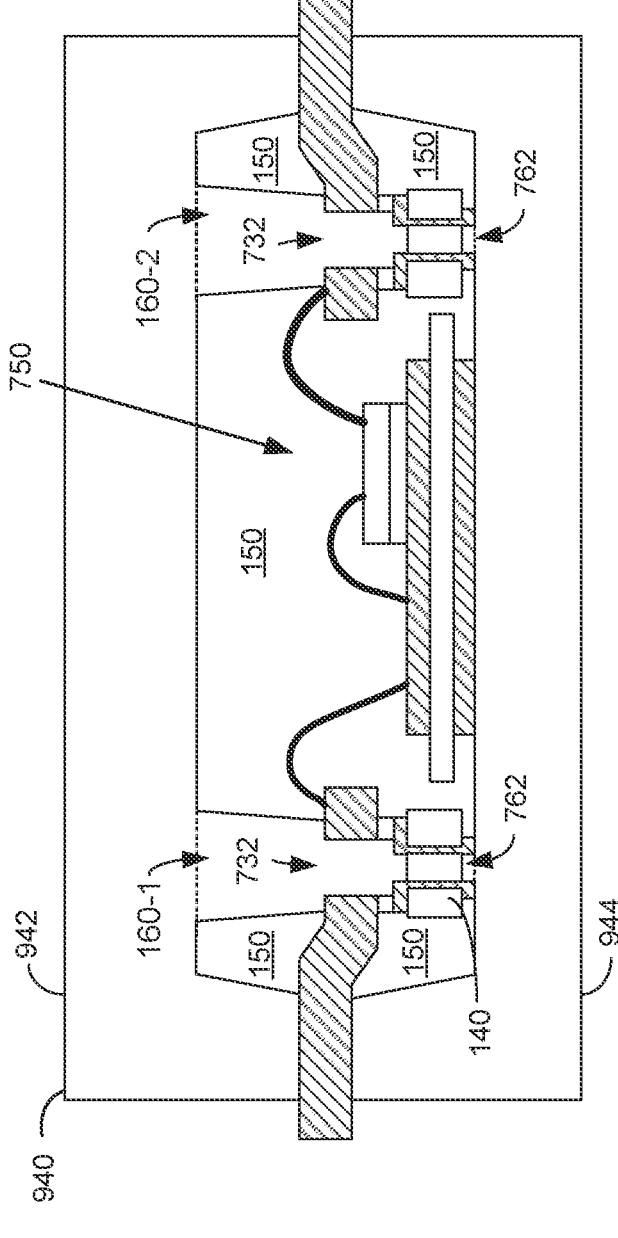

FIG. 9D shows the unmolded assembly 750 placed and encapsulated in mold body 150 in mold cavity 940.

Figure 10:
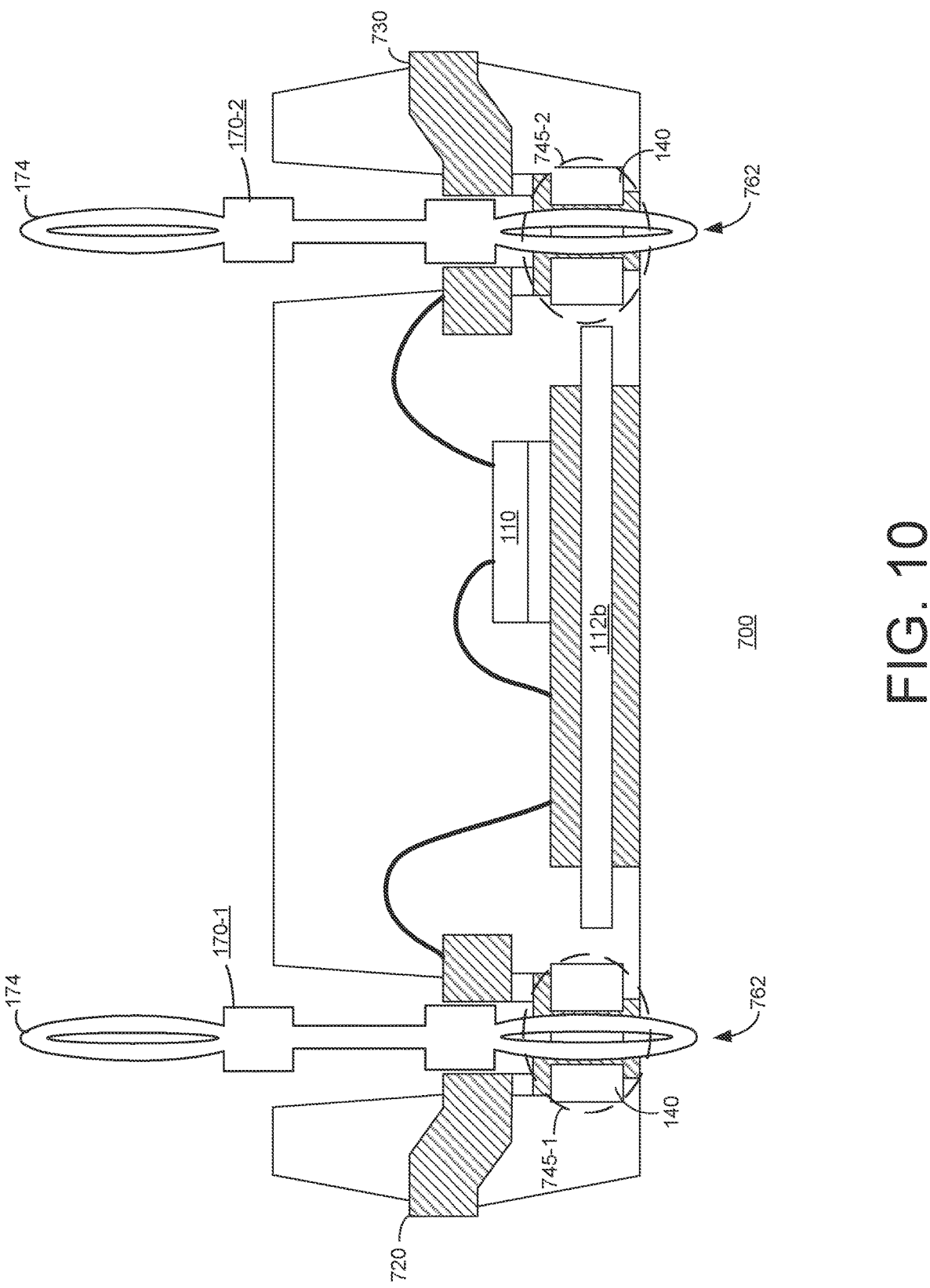
FIG. 10 illustrates the power module of FIG. 7 with a pair of press-fit pins inserted in press-fit pin couplers to couple to a pair of lead frames of the module.

At a fourth stage of construction, as shown in FIG. 10, the molded assembly (e.g., power module 700 encapsulated in mold body 150) may be taken out of mold cavity 940. Power module 700 encapsulated in mold body 150 includes press-fit pin coupler 745-1/board 140 having PTHs (e.g., hole 762) adapted to receive a press-fit pin (e.g., for a power lead) in TMV 160-1 to couple lead frame portion 720a and lead frame portion 720b (of lead frame 730) across TMV 160-1. Power module 700 further includes press-fit pin coupler 745-2/board 140 having PTHs (e.g., hole 762) adapted to receive a press-fit pin (e.g., for a signal lead) in TMV 160-2 to couple lead frame portion 730a and lead frame portion 730*b* (of lead frame 730) across TMV 160-2. As shown in FIG. 10, for example, a first press-fit pin 170-1 can be inserted in hole 162 of board 140 through TMV 160-1 to form a power lead of power module 100, and a second press-fit pin 170-2 can be inserted in hole 162 of board 140 through TMV 160-2 to form a signal lead of power module 700.

In some example implementations, like in module 100 (FIG. 5H), a pin may be disposed in the TMVs (TMV 160-1 or TMV 160-2) in module 700 and attached to a portion of the substrate lead frame in the TMV using one of a solder, an adhesive or an interference fit. In example implementation, a pin (e.g., pin 180, FIG. 5H) that is not a press-fit pin, may disposed in TMV 160-1 or TMV 160-2 of module 700 for connection to the substrate lead frames (lead frame 720 or lead frame 730) (via boards 140) and form a signal lead or a power lead of power module 700.

Using pins (e.g., press-fit pin 170, press-fit pin 170-1, press-fit pin 170-2, or pin 180) in the press-fit pin couplers described in the foregoing to form the power leads (in addition to forming the signal leads) of power module 700 may avoid a need to weld or screw the power lead frame (e.g., lead frame 720) to a power terminal of a host electronics application (e.g., a customer machine of device).

Dual ended press-fit pins (e.g., press-fit pin 170-1) may be used to attach the power lead frame (e.g., lead frame 720) of power module 700 to a power terminal of a substrate (e.g., PCB 610, FIG. 6; PCB 1010, FIG. 11) in the host electronics application. A first end (e.g., first end 172) of press-fit pin 170-1 may be coupled to the power module in press-fit pin coupler 745-1 or press-fit pin coupler 745-2. The second end (e.g., second end 174) of press-fit pin 170-1 may be press-fit in a socket (not shown) or a plated-through hole (not shown) in the substrate (e.g., PCB 610, FIG. 6) of the host electronics application.

In example implementations, power module 700 with the press-fit pins (e.g., press-fit pin 170, press-fit pin 170-1, press-fit pin 170-2, or pin 180, etc.) may be coupled to an external substrate (e.g., a printed circuit board (PCB) of a host power electronics circuit.

Figure 11:
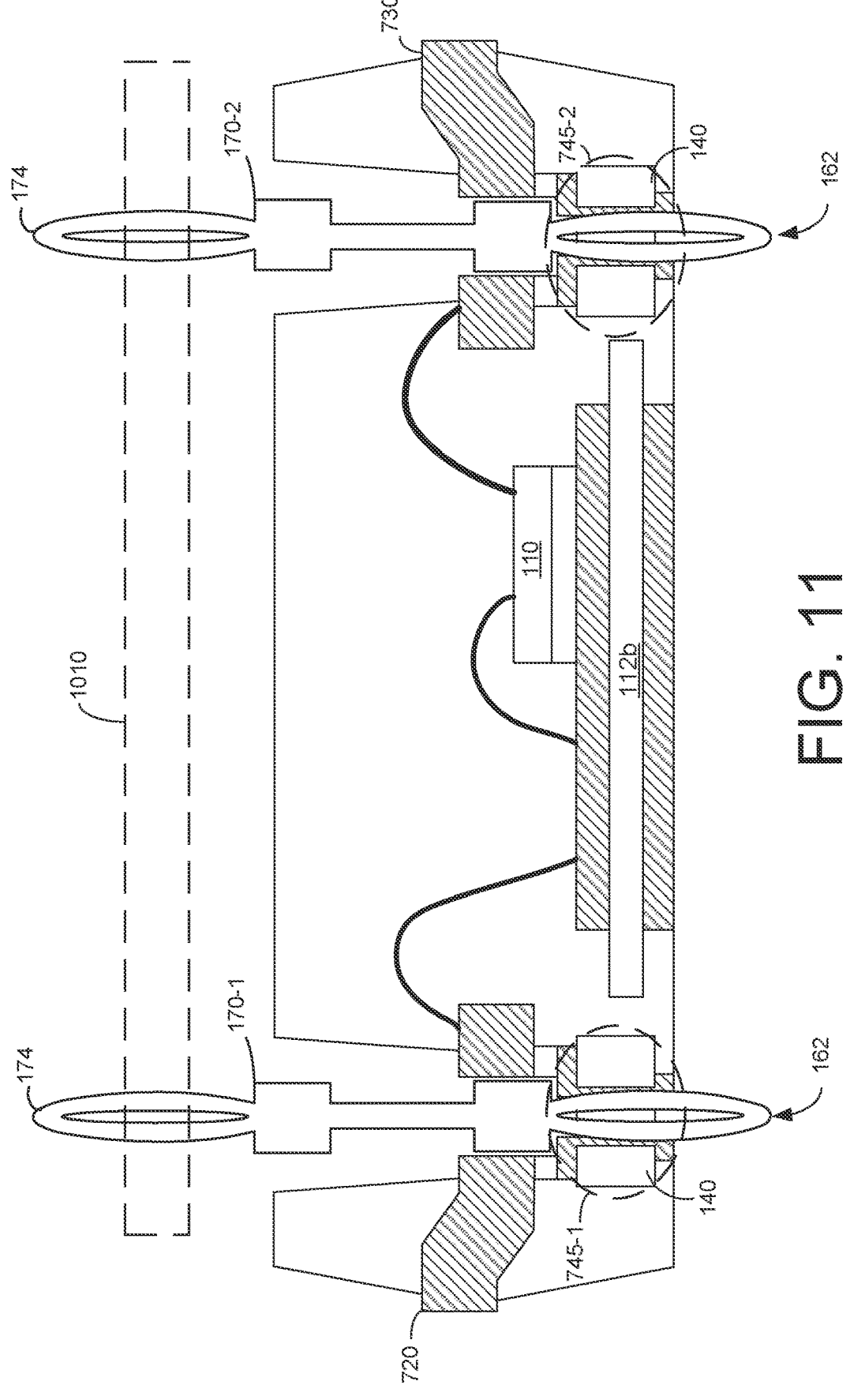
FIG. 11 schematically illustrates a power module attached to an external substrate of a host electronics application.

FIG. 11 schematically illustrates power module 700 attached to an external substrate (e.g., PCB 1010) of a host electronics application. In power module 700, the first end (e.g., first end 172) of press-fit pin 170-1 is coupled to the power module in press-fit pin coupler 745-1. The second end (e.g., second end 174) of press-fit pin 170-1 may be press-fit in a socket (not shown) or a plated-through hole (not shown) or soldered to a trace (not shown) in PCB 1010 of the host electronics application. Press-fit pin 170-1 may connect a power lead frame (e.g., lead frame 720) for power input/ output to the external substrate (e.g., PCB 1010). Further, the first end (e.g., first end 172) of press-fit pin 170-2 is coupled to the power module in press-fit pin coupler 745-2. The second end (e.g., second end 174) of press-fit pin 170-2 may be press-fit in a socket (not shown) or a plated-through hole (not shown) or soldered to a trace (not shown) in PCB 1010. Press-fit pin 170-1 may connect a signal lead frame (e.g., lead frame 730) for signal input/output to the external substrate (e.g., PCB 1010) of the host electronics application.

It will be understood, for purposes of this disclosure, that when an element, such as a layer, a region, or a substrate, is referred to as being on, disposed on, disposed in, connected to, electrically connected to, coupled to, or electrically coupled to another element, it may be directly on, connected or coupled to the other element, or one or more intervening elements may be present. In contrast, when an element is referred to as being directly on, directly disposed on, directly disposed in, directly connected to, or directly coupled to another element or layer, there are no intervening elements or layers present. Although the terms directly on, direct in, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to, vertically adjacent to, or horizontally adjacent to.

Some implementations may be implemented using various semiconductor processing and/or packaging techniques. Some implementations may be implemented using various types of semiconductor processing techniques associated with semiconductor substrates including, but not limited to, for example, silicon (Si), gallium arsenide (GaAs), gallium nitride (GaN), silicon carbide (SiC), and/or so forth.

While certain features of various example implementations have been illustrated as described herein, many modifications, substitutions, changes, and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A module comprising:
   an assembly including a semiconductor device die coupled to a lead frame,
   a board disposed below the lead frame, the board including a plated-through hole (PTH) aligned with an opening in the lead frame above the board; and
   a mold body encapsulating at least a portion of the assembly, the mold body including a through-mold via (TMV) aligned with the opening in the lead frame and with the PTH, the PTH being physically accessible from outside the mold body through the TMV and the opening in the lead frame.

2. The module of claim 1, further comprising:
   a pin having an end that is press fitted in the PTH through the TMV.

3. The module of claim 2, wherein the end of the pin has an eye-of-needle style structure.

4. The module of claim 2, wherein the end of the pin is a first end of the pin, and a second end of the pin is coupled to an external substrate.

5. The module of claim 1, wherein the board is a printed circuit board (PCB).

6. A method comprising:

forming an assembly including a semiconductor device die and at least one lead frame connected to the semiconductor device die, the at least one lead frame including a substrate, the substrate including at least one plated-through hole (PTH) aligned with an opening in the least one lead frame; and encapsulating the assembly in a mold body with a through-mold via (TMV) aligned with the opening in the at least one lead frame and with a portion of the substrate including the at least one PTH, the at least one PTH being exposed in the TMV to an environment outside the mold body and being physically accessible from outside the mold body through the TMV.

7. The module of claim 6, wherein the semiconductor device die is disposed on a direct bonded metal (DBM) substrate, and wherein the assembly includes a wire bond between the semiconductor device die and the DBM substrate.

8. The module of claim 7, wherein the assembly includes at least a wire bond between the DBM substrate and the lead frame or a wire bond between the semiconductor device die and the lead frame.

9. The module of claim 6, wherein the mold body encapsulating the assembly is made of an epoxy molding compound (EMC).

10. The module of claim 1, further comprising:

a pin disposed in the TMV and attached to the lead frame using one of a solder, an adhesive or an interference fit.

11. A module comprising:

a power device encapsulated in a mold body; and a lead frame electrically connected to the power device encapsulated in the mold body, the lead frame including a press-fit pin coupler, a portion of the press-fit pin coupler being disposed outside the mold body, wherein the press-fit pin coupler includes a substrate having a plated-through hole (PTH), the PTH being physically accessible from outside the mold body through a through-mold via (TMV) in the mold body.

12. The module of claim 11, further comprising:

a pin that is coupled to the press-fit pin coupler and extends outside the mold body.

13. The module of claim 12, wherein the pin is press fitted in the PTH, the pin having an end with an eye-of-needle style structure.

14. The module of claim 13, wherein the pin that is press fitted in the PTH is a double-sided press-fit pin.

15. The module of claim 11, wherein the power device includes at least one of an insulated-gate bipolar transistor (IGBT) and a metal-oxide-semiconductor field-effect transistor (MOSFET).

16. The module of claim 6, wherein the semiconductor device die includes at least one of an insulated-gate bipolar transistor (IGBT) and a metal-oxide-semiconductor field-effect transistor (MOSFET).

17. The method of claim 6, further comprising:

press fitting an end of a pin in the at least one PTH through the TMV.

18. The method of claim 17, wherein the end of the pin is a first end of the pin, and the method further comprises coupling a second end of the pin to an external substrate.

19. The method of claim 6, wherein the substrate is a printed circuit board (PCB).

20. The method of claim 6, wherein the semiconductor device die includes at least one of an insulated-gate bipolar transistor (IGBT) and a metal-oxide-semiconductor field-effect transistor (MOSFET).

21. The method of claim 17, wherein the end of the pin has an eye-of-needle style structure.

* * * * *